(12) United States Patent
Mori et al.

(10) Patent No.: US 11,050,966 B2
(45) Date of Patent: Jun. 29, 2021

(54) SOLID-STATE IMAGING DEVICE, METHOD FOR DRIVING SOLID-STATE IMAGING DEVICE, AND ELECTRONIC APPARATUS

(71) Applicant: BRILLNICS SINGAPORE PTE. LTD., Singapore (SG)

(72) Inventors: Kazuya Mori, Tokyo (JP); Shunsuke Okura, Tokyo (JP); Isao Takayanagi, Tokyo (JP)

(73) Assignee: BRILLNICS SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/604,953

(22) PCT Filed: Apr. 11, 2018

(86) PCT No.: PCT/JP2018/015195
§ 371 (c)(1),
(2) Date: Oct. 11, 2019

(87) PCT Pub. No.: WO2018/190363
PCT Pub. Date: Oct. 18, 2018

(65) Prior Publication Data
US 2020/0162691 A1    May 21, 2020

(30) Foreign Application Priority Data

Apr. 12, 2017  (JP) .............................. JP2017-078696

(51) Int. Cl.
| H04N 5/369 | (2011.01) |
| H04N 5/355 | (2011.01) |
| H04N 5/378 | (2011.01) |

(52) U.S. Cl.
CPC ........... *H04N 5/379* (2018.08); *H04N 5/3559* (2013.01); *H04N 5/378* (2013.01)

(58) Field of Classification Search
CPC ...... H04N 5/379; H04N 5/378; H04N 5/3559; H01L 27/14636; H01L 27/14641
See application file for complete search history.

(56) References Cited

U.S. PATENT DOCUMENTS

2015/0108595 A1    4/2015  Uesaka et al.
2015/0350574 A1   12/2015  Okado
(Continued)

FOREIGN PATENT DOCUMENTS

| EP | 3073729 A1 | 9/2016 |
| JP | 2014033047 A | 2/2014 |

(Continued)

OTHER PUBLICATIONS

Patent Cooperation Treaty, International Search Report for PCT/JP2018/015195, dated Jul. 10, 2018, pp. 1-3.
(Continued)

*Primary Examiner* — Antoinette T Spinks
(74) *Attorney, Agent, or Firm* — Pillsbury Winthrop Shaw Pittman LLP

(57) ABSTRACT

In a solid-state imaging device 10, the first binning switch 81 is formed such that a MOS capacitance and a wire capacitance of a wire connected to the binning switch 81, each having a value in accordance with an ON or OFF state, are added to a capacitance of a floating diffusion FD of a pixel PXL to be read, so as to optimize the capacitance of the floating diffusion FD and optimally adjust a conversion gain in accordance with a mode. This operation increases an image quality.

18 Claims, 26 Drawing Sheets

(56) References Cited

U.S. PATENT DOCUMENTS

| 2016/0337567 A1 | 11/2016 | Okura et al. |
| 2016/0373668 A1 | 12/2016 | Komai et al. |
| 2017/0070691 A1 | 3/2017 | Nishikido |

FOREIGN PATENT DOCUMENTS

| JP | 201579899 A | 4/2015 |
| JP | 2015226161 A | 12/2015 |
| JP | 201615680 A | 1/2016 |
| JP | 5897752 B1 | 3/2016 |
| JP | 201755248 A | 3/2017 |

OTHER PUBLICATIONS

Patent Cooperation Treaty, International Written Opinion for PCT/JP2018/015195, dated Jul. 10, 2018, pp. 1-8.
European Patent Office, Extended European Search Report issued in EP 18783757.0, dated Sep. 14, 2020, pp. 1-9.

| Gain option | BIN_MC | Total FD capacitance = Ctot |
|---|---|---|
| High | off | C0 + C1 + C2 + C3 = Cbin1 |
| Low | on | Cbin1 + Cbin2 ; Cbin2 = C4 + C5 |

(Comparative Example)

(Comparative Example)

| Gain option | BIN_FD | BIN_MC | Total FD capacitance = Ctot |
|---|---|---|---|
| High | off | off | C10 + C11 + C12 + C13 = Cbin11 |
| Middle | on | off | Cbin11 + Cbin13 ; Cbin13 = C14 + C15 + C16 + C17 |
| Low | on | on | Cbin11 + Cbin13 + Cbin12 ; Cbin12 = C18 + C19 + C20 |

Fig. 14

SOLID-STATE IMAGING DEVICE, METHOD FOR DRIVING SOLID-STATE IMAGING DEVICE, AND ELECTRONIC APPARATUS

CROSS-REFERENCE TO RELATED APPLICATIONS

This patent application is a national stage application of and claims priority from International Application no. PCT/JP2018/015195, filed on Apr. 11, 2018, which claims foreign priority to Japanese Patent application No. 2017-078696, filed on Apr. 12, 2017, the contents of which are herein entirely incorporated by reference thereto.

TECHNICAL FIELD

The present invention relates to a solid-state imaging device, a method for driving a solid-state imaging device, and an electronic apparatus.

BACKGROUND

A solid-state imaging device (image sensor) including photoelectric conversion elements for detecting light and generating a charge is embodied in CMOS (complementary metal oxide semiconductor) image sensors, which have been in practical use. The CMOS image sensors have been widely applied as parts of various types of electronic apparatuses such as digital cameras, video cameras, surveillance cameras, medical endoscopes, personal computers (PCs), mobile phones and other portable terminals (mobile devices).

A CMOS image sensor includes, for each pixel, a photodiode (a photoelectric conversion element) and a floating diffusion (FD) amplifier having a floating diffusion (FD). The mainstream design of the reading operation in CMOS image sensors is a column parallel output processing performed by selecting a row in a pixel array and reading the pixels simultaneously in the column direction.

To improve characteristics, various methods have been proposed for fabricating a CMOS image sensor that has a wide dynamic range and provides a high picture quality (see, for example, Patent Literature 1).

In the solid-state imaging device disclosed in Patent Literature 1, switches connected in each pixel are switched to adjust the capacitance of the floating diffusion FD provided in the pixel during a signal reading period for the pixel, so as to efficiently adjust the conversion gain resulting from the charge-voltage conversion of light signals from a subject and maximize the range of convertible light signals. In this solid-state imaging device, the capacitance of the floating diffusion FD is adjusted stepwise by changing the number of switches connected to the photodiode, connected to the transfer gate, or connected in series to the floating diffusion FD, so as to adjust the gain.

For a small amount of signal, or a low luminous intensity, the sensitivity of such a solid-state imaging device can be improved by minimizing the number of the connected switches to reduce the capacitance of the floating diffusion FD and increase the conversion gain. On the other hand, for a large amount of signal, or a high luminous intensity, the sensitivity is reduced by increasing the number of the connected switches stepwise to increase the capacitance of the floating diffusion FD and reduce the conversion gain. For a large amount of signal charges, all the signal charges are converted into voltages after the charge-voltage conversion, such that the signal charge-voltage conversion is possible between low and high luminous intensities, resulting in a wide dynamic range.

RELEVANT REFERENCES

List of Relevant Patent Literature

Patent Literature 1: Japanese Patent No. 5897752

SUMMARY

In the above solid-state imaging device, the dynamic range can be widened by increasing the number of the switches connected in series to the floating diffusion FD to increase the capacitance of the floating diffusion FD, which results in a large difference in conversion efficiency.

However, particularly when the above solid-state imaging device is designed such that, in one exposure period, the number of the connected switches is changed to change the conversion gain dynamically and the signals are read out for a plurality of times so as to enhance the dynamic range performance for videos, large noises may occur in switching the signals to degrade the SN ratio of the images including signals around the switching, unfavorably resulting in a low image quality.

The object of the present invention is to provide a solid-state imaging device, a method for driving a solid-state imaging device, and an electronic apparatus that can improve the image quality.

The solid-state imaging device of the first aspect of the present invention comprises a pixel part including pixels arranged therein, wherein the pixels each include: a photoelectric conversion part for storing therein, in a storage period, charges generated by photoelectric conversion; a charge transfer gate part for transferring, in a transfer period, the charges stored in the photoelectric conversion part; a floating diffusion to which the charges stored in the photoelectric conversion part are transferred through the charge transfer gate part; a source follower element for converting the charges in the floating diffusion into a voltage signal with a conversion gain corresponding to the quantity of the charges; and a capacitance changing part for changing a capacitance of the floating diffusion in accordance with a capacitance changing signal, wherein the capacitance of the floating diffusion is changed by the capacitance changing part in a predetermined period within one reading period associated with the storage period, such that the conversion gain is changed within the one reading period, wherein the capacitance changing part includes a binning switch connected between the floating diffusions of at least two pixels adjacent to each other, the binning switch being formed of a field effect transistor configured to be brought into ON or OFF state selectively in accordance with the capacitance changing signal, wherein the capacitance changing part is capable of changing the conversion gain of the floating diffusion of an associated pixel to be read, wherein the binning switch is formed such that at least one of a parasitic capacitance and a wire capacitance of a wire connected to the binning switch, each having a value in accordance with the ON or OFF state, is added to the capacitance of the floating diffusion of the associated pixel.

The second aspect of the present invention is a method of driving a solid-state imaging device, the solid-state imaging device including a pixel part including pixels arranged therein, wherein the pixels each include: a photoelectric conversion part for storing therein, in a storage period, charges generated by photoelectric conversion; a charge transfer gate part for transferring, in a transfer period, the charges stored in the photoelectric conversion part; a floating diffusion to which the charges stored in the photoelectric conversion part are transferred through the charge transfer gate part; a source follower element for converting the charges in the floating diffusion into a voltage signal with a conversion gain corresponding to the quantity of the charges; and a capacitance changing part for changing a capacitance of the floating diffusion in accordance with a capacitance changing signal, and wherein the capacitance of the floating diffusion is changed by the capacitance changing part in a predetermined period within one reading period associated with the storage period, such that the conversion gain is changed within the one reading period, the method comprising: forming the capacitance changing part by connecting between the floating diffusions of at least two pixels adjacent to each other with a binning switch formed of a field effect transistor; forming the binning switch such that at least one of a parasitic capacitance and a wire capacitance of a wire connected to the binning switch, each having a value in accordance with the ON or OFF state, is added to the capacitance of the floating diffusion of the associated pixel; and changing a conversion gain of the floating diffusion of an associated pixel to be read, by bringing the binning switch into ON or OFF state selectively in accordance with the capacitance changing signal.

An electronic apparatus according to the third aspect of the present invention comprises: a solid-state imaging device; and an optical system for forming a subject image on the solid-state imaging device, wherein the solid-state imaging device includes a pixel part including pixels arranged therein, wherein the pixels each include: a photoelectric conversion part for storing therein, in a storage period, charges generated by photoelectric conversion; a charge transfer gate part for transferring, in a transfer period, the charges stored in the photoelectric conversion part; a floating diffusion to which the charges stored in the photoelectric conversion part are transferred through the charge transfer gate part; a source follower element for converting the charges in the floating diffusion into a voltage signal with a conversion gain corresponding to the quantity of the charges; and a capacitance changing part for changing a capacitance of the floating diffusion in accordance with a capacitance changing signal, wherein the capacitance of the floating diffusion is changed by the capacitance changing part in a predetermined period within one reading period associated with the storage period, such that the conversion gain is changed within the one reading period, wherein the capacitance changing part includes a binning switch connected between the floating diffusions of at least two pixels adjacent to each other, the binning switch being formed of a field effect transistor configured to be brought into ON or OFF state selectively in accordance with the capacitance changing signal, wherein the capacitance changing part is capable of changing the conversion gain of the floating diffusion of an associated pixel to be read, and wherein the binning switch is formed such that at least one of a parasitic capacitance and a wire capacitance of a wire connected to the binning switch, each having a value in accordance with the ON or OFF state, is added to the capacitance of the floating diffusion of the associated pixel.

Advantages

The present invention increases the image quality.

BRIEF DESCRIPTION OF THE DRAWINGS

FIG. 6 is used to illustrate additional capacitance components to be added to the capacitance of the floating diffusion.

FIG. 13 is used to illustrate additional capacitance components to be added to the capacitance of the floating diffusion.

FIG. 14 shows a comparative relationship among the ON or OFF states of the first binning transistor and a second binning transistor, the conversion gain, and the adjusted total capacitance of the floating diffusion in the third embodiment.

FIG. 20 is used to illustrate a method of forming inter-wire capacitances therein.

FIG. 21 is used to illustrate a method of forming inter-wire capacitances therein.

FIG. 22 is used to illustrate a method of forming inter-wire capacitances therein.

DESCRIPTION OF THE EMBODIMENTS

Embodiments of the present invention will be hereinafter described with reference to the drawings.

First Embodiment

Figure 1:
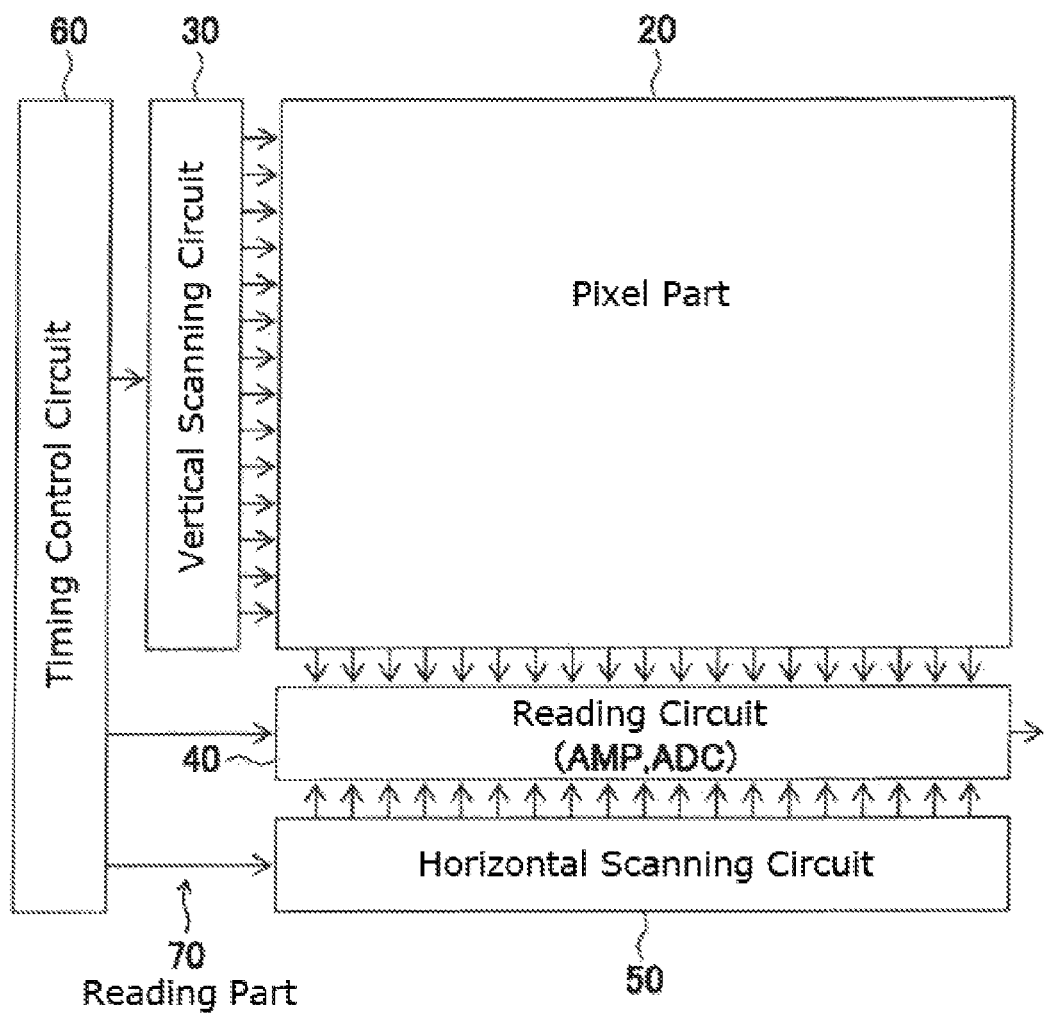
FIG. 1 is a block diagram showing an example configuration of a solid-state imaging device according to a first embodiment of the present invention.

FIG. 1 is a block diagram showing an example configuration of a solid-state imaging device according to a first embodiment of the present invention. In this embodiment, the solid-state imaging device 10 is constituted by for example a CMOS image sensor.

As shown in FIG. 1, the solid-state imaging device 10 is constituted mainly by a pixel part 20 serving as an image capturing part, a vertical scanning circuit (a row scanning circuit) 30, a reading circuit (a column reading circuit) 40, a horizontal scanning circuit (a column scanning circuit) 50, and a timing control circuit 60. Among these components, for example, the vertical scanning circuit 30, the reading circuit 40, the horizontal scanning circuit 50, and the timing control circuit 60 constitute the reading part 70 for reading out pixel signals.

In the first embodiment, the solid-state imaging device 10 includes (the pixel part 20 or) pixels arranged in a matrix form in the pixel part 20, each pixel including a capacitance changing part that can change the capacitance of the floating diffusion in accordance with a capacitance changing signal. In the solid-state imaging device 10, the capacitance of the floating diffusion is changed by the capacitance changing part in a predetermined period within one reading period after one charge storage period (exposure period), and the conversion gain is changed within the reading period.

In the first embodiment, the reading part 70 can perform first conversion gain mode reading and second conversion gain mode reading in a single reading period. In the first conversion gain mode reading, the reading part 70 reads pixel signals with a first conversion gain corresponding to a first total capacitance set by the capacitance changing part, and in the second conversion gain mode reading, the reading part 70 reads pixel signals with a second conversion gain corresponding to a second total capacitance (that is different from the first total capacitance) set by the capacitance changing part. That is, the solid-state imaging device 10 of the embodiment is a solid-state imaging element with a wide dynamic range that is configured to output both bright signals and dark signals by switching, in a single reading period, the interior of the pixels between a first conversion gain (e.g., a high conversion gain) mode and a second conversion gain (e.g., a low conversion gain) mode for outputting signals generated from the charges (electrons) produced by the photoelectric conversion in a single storage period (exposure period). Moreover, in some configuration, it is also possible to perform third conversion gain mode reading in which the reading part 70 reads pixel signals with a third conversion gain (a middle conversion gain) corresponding to a third total capacitance (that is different from the first total capacitance and the second total capacitance) set by the capacitance changing part. The third conversion gain mode reading will be described later.

In the first embodiment, the capacitance changing part includes binning switches (binning transistors). In the first embodiment, the capacitance changing part is constituted by first binning switches, instead of a capacitor. One of the first binning switches is connected to (disposed on) the wire formed between the floating diffusions FD of two pixels PXLn adjacent to each other in the column direction, and the other is connected between the floating diffusion FD of the pixel PXLn+1 and the power supply line VDD. In the first embodiment, the first binning switch is switched between ON and OFF states by a capacitance changing signal, so as to change the number of connected floating diffusions FD to one or a plural number, change the capacitance of the floating diffusion FD of the pixel to be read, and change the conversion gain of the floating diffusion FD of the pixel to be read. Moreover, in the first embodiment, the first binning switch is formed such that at least one of a parasitic capacitance and a wire capacitance of the wire connected to the binning switch, each having a value in accordance with the ON or OFF state, is added to the capacitance of the floating diffusion FD of the pixel. Thus, the solid-state imaging device 10 of the embodiment is configured such that the capacitance of the floating diffusion FD can be optimally adjusted to obtain a desired optimal value of the conversion gain in accordance with the mode, and the SN ratio at the changing point of the conversion gain can be optimized to obtain desired output characteristics that result in a high image quality.

The reading part 70 of the first embodiment basically performs the first conversion gain mode reading and the second conversion gain mode reading in the storage period subsequent to the reset period in which the charges of the photodiode and the floating diffusion are discharged. In the embodiment, the reading part 70 performs at least one of the first conversion gain mode reading and the second conversion gain mode reading in the reading period after at least one transfer period performed after the reading period subsequent to the reset period. That is, the reading part 70 may perform both the first conversion gain mode reading and the second conversion gain mode reading in the reading period after the transfer period. Moreover, the reading part 70 may perform the third conversion gain mode reading in which pixel signals are read with a third conversion gain (a middle conversion gain).

In a normal pixel reading operation, a shutter scan and then a reading scan are performed by driving of the pixels by the reading part 70. The first conversion gain mode reading (HCG), the second conversion gain mode reading (LCG), and the third conversion gain mode reading (MCG) are performed in the period of the reading scan.

A description will be hereinafter given of an outline of the configurations and functions of the parts of the solid-state imaging device 10 and then details of configuration of the capacitance changing part and the reading process related thereto.

<Configurations of Pixel Part 20 and Pixels PXL>

In the pixel part 20, a plurality of pixels each including a photodiode (a photoelectric conversion element) and an in-pixel amplifier are arranged in a two-dimensional matrix comprised of N rows and M columns.

Figure 2:
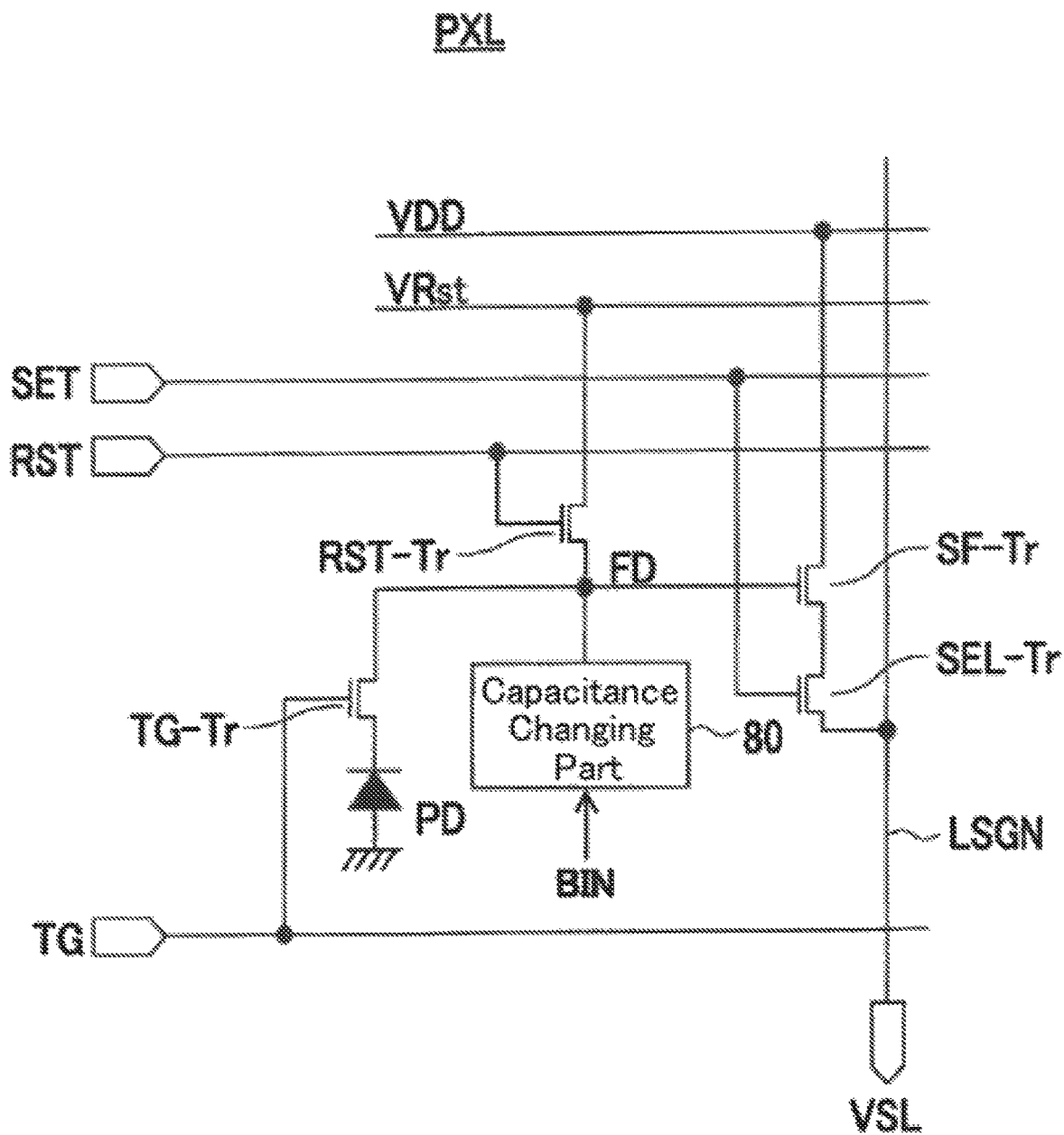
FIG. 2 is a circuit diagram showing an example of a pixel according to the first embodiment.

FIG. 2 is a circuit diagram showing an example of a pixel according to the embodiment.

The pixel PXL includes, for example, a photodiode (PD) serving as a photoelectric conversion part (a photoelectric conversion element). For the photodiode PD, the pixel PXL includes one transfer transistor TG-Tr serving as a charge transfer gate part (a transfer element), one reset transistor RST-Tr serving as a reset element, one source follower transistor SF-Tr serving as a source follower element, and one selection transistor SEL-Tr serving as a selection element (selection switch).

The pixel PXL further includes a capacitance changing part 80 that is connected to the floating diffusion FD and is capable of changing the capacitance of the floating diffusion FD in accordance with a capacitance changing signal BIN.

The photodiode PD generates signal charges (electrons) in an amount in accordance with the quantity of the incident light and stores the same. A description will be hereinafter given of a case where the signal charges are electrons and each transistor is an n-type transistor. However, it is also possible that the signal charges are holes or each transistor is a p-type transistor. Further, this embodiment is also applicable to the case where a plurality of photodiodes share the transistors or the case where the pixel includes three transistors (3Tr) other than the selection transistor.

The photodiode (PD) in each pixel PXL is a pinned photodiode (PPD). On a substrate surface for forming the photodiodes (PD), there is a surface level due to dangling bonds or other defects, and therefore, a lot of charges (dark current) are generated due to heat energy, so that signals fail to be read out correctly. In a pinned photodiode (PPD), a charge storage part of the photodiode (PD) is pinned in the substrate to reduce mixing of the dark current into signals.

The transfer transistor TG-Tr is connected between the photodiode PD and the floating diffusion FD and controlled by a control signal TG applied to the gate thereof through a control line. The transfer transistor TG-Tr remains selected and in the conduction state during a transfer period in which the control signal TG is at a high (H) level, to transfer to the floating diffusion FD the charges (electrons) produced by the photoelectric conversion and then stored in the photodiode PD.

The reset transistor RST-Tr is connected between a power supply line VRst and the floating diffusion FD and controlled through a control line RST. It is also possible that the reset transistor RST-Tr is connected between the power supply line VDD and the floating diffusion FD and controlled through the control line RST. The reset transistor RST-Tr remains selected and in the conduction state during a period in which the control signal RST is at the H level, to reset the floating diffusion FD to the potential of the power supply line VRst (or VDD).

In the first embodiment, as will be described later, the first binning transistor (81n, 81n+1) used as the capacitance changing part 80 may serve as a reset element. Further, it is also possible that all of a plurality of pixels connected together via the first binning transistors (81n, 81n+1) share the reset element formed of the first binning transistor (81n+1) that discharges the charges of the floating diffusion FD during the reset period PR.

The source follower transistor SF-Tr and the selection transistor SEL-Tr are connected in series between the power supply line VDD and a vertical signal line LSGN. The gate of the source follower transistor SF-Tr is connected to the floating diffusion FD, and the selection transistor SEL-Tr is controlled through a control signal SEL. The selection transistor SEL-Tr remains selected and in the conduction state during a period in which the control signal SEL is at the H level. In this way, the source follower transistor SF Tr outputs, to the vertical signal line LSGN, a read-out signal VSL of a column output obtained by converting the charges in the floating diffusion FD into a voltage signal with a gain corresponding to the quantity of the charges (potential). These operations are performed simultaneously in parallel for pixels in each row since, for example, the gates of the transfer transistor TG-Tr, the reset transistor RST-Tr, and the selection transistor SEL-Tr in each row are connected to each other.

Since the pixel part 20 includes the pixels PXL arranged in N rows and M columns, there are N control lines for each of the control signals SEL, RST and TG, and M vertical signal lines LSGN. In FIG. 1, each of the control lines for the control signals SEL, RST, TG is represented as one row-scanning control line.

The vertical scanning circuit 30 drives the pixels in shutter rows and reading rows through the row-scanning control lines in accordance with the control of the timing control circuit 60. Further, the vertical scanning circuit 30 outputs, according to address signals, row selection signals indicating the row addresses of the reading row from which signals are to be read out and the shutter row in which the charges stored in the photodiodes PD are to be reset.

As described above, in a normal pixel reading operation, a shutter scan and then a reading scan are performed by driving of the pixels by the vertical scanning circuit 30 of the reading part 70.

Figure 3A:
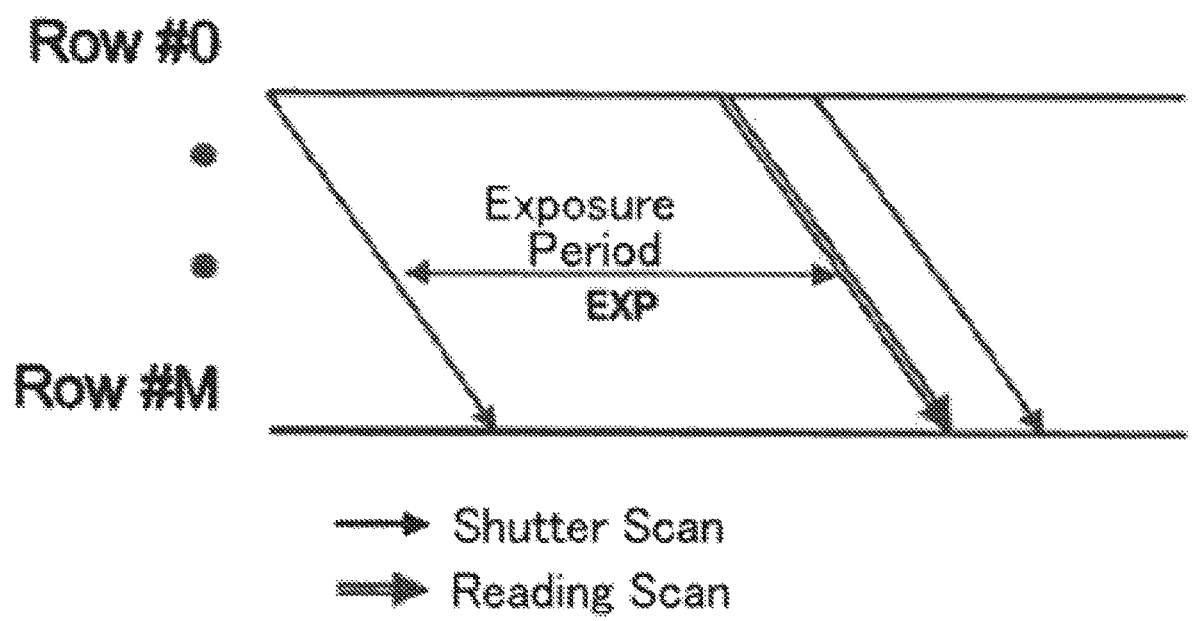
FIGS. 3A and 3B show operation timings of a shutter scan and a reading scan in a normal pixel reading operation according to the embodiment.
Figure 3B:
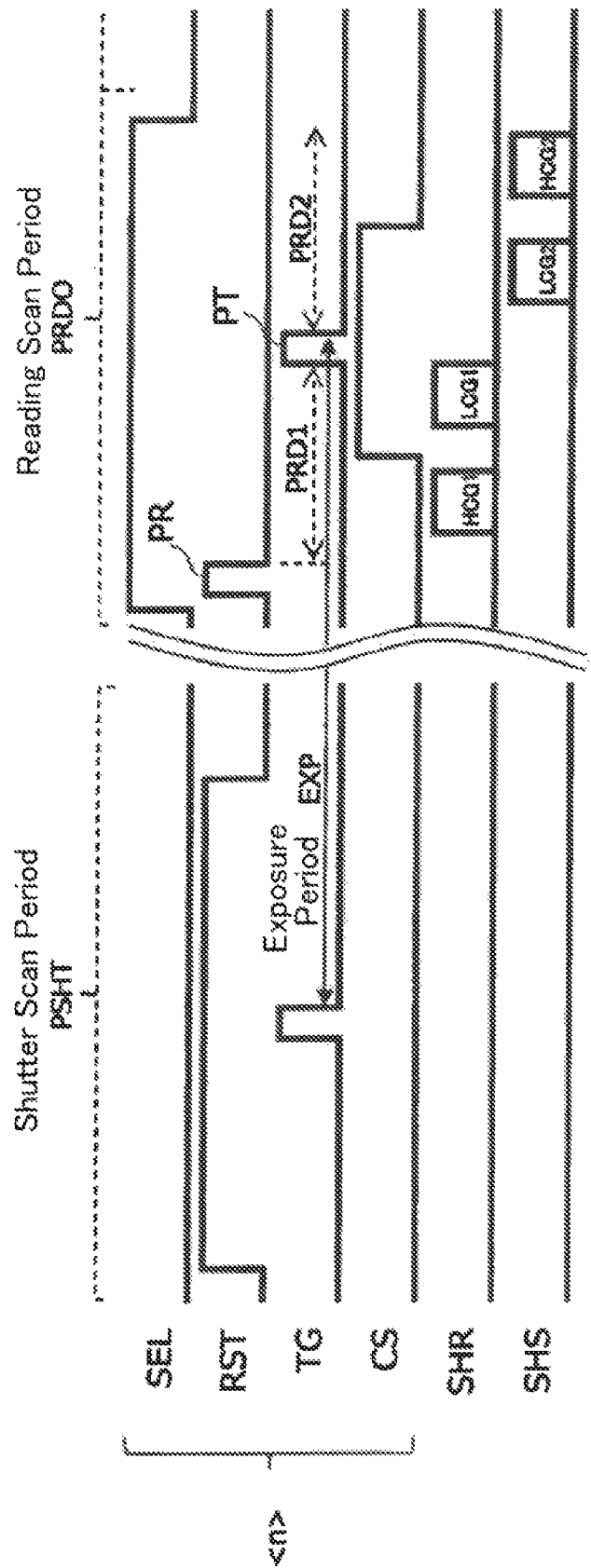

FIGS. 3A and 3B show operation timings of a shutter scan and a reading scan in a normal pixel reading operation according to the embodiment.

The control signal SEL, which controls the ON (conductive) state and the OFF (non-conductive) state of the selection transistor SEL-Tr, remains at the L level during a shutter scan period PSHT to retain the selection transistor SEL-Tr in the non-conduction state, and the control signal SEL remains at the H level during a reading scan period PRDO to retain the selection transistor SEL Tr in the conduction state. During the shutter scan period PSHT, the control signal TG remains at the H level for a predetermined period within the period in which the control signal RST is at the H level, such that the photodiode PD and the floating diffusion FD are reset through the reset transistor RST-Tr and the transfer transistor TG-Tr.

During the reading scan period PRDO, the control signal RST remain at the H level for a predetermined period, or a reset period PR, to reset the floating diffusion FD through the reset transistor RST-Tr, and a signal in a reset state is read out in a reading period PRD1 after the reset period PR. After the reading period PRD1, the control signal TG remains at the H level for a predetermined period, or a transfer period PT, to transfer the stored charges in the photodiode PD to the floating diffusion FD through the transfer transistor TG-Tr, and a signal corresponding to the stored charges (electrons) is read out during a reading period PRD2 after the transfer period PT.

In the normal pixel reading operation according to the first embodiment, a storage period (exposure period) EXP spans from the time in the shutter scan period PSHT at which the control signal TG is switched to the L level after the photodiode PD and the floating diffusion FD are reset to the time in the reading scan period PRDO at which the control signal TG is switched to the L level to terminate the transfer period PT.

The reading circuit 40 includes a plurality of column signal processing circuits (not shown) arranged corresponding to the column outputs of the pixel part 20, and the reading circuit 40 may be configured such that the plurality of column signal processing circuits can perform column parallel processing.

The reading circuit 40 may include a correlated double sampling (CDS) circuit, an analog-digital converter (ADC), an amplifier (AMP), a sample/hold (S/H) circuit, and the like.

Figure 4A:
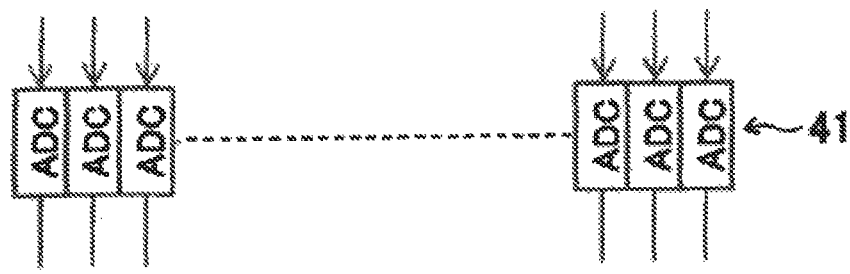
FIGS. 4A to 4C illustrate example configurations of a column output reading system in a pixel part of a solid-state imaging device according to an embodiment of the present invention.
Figure 4B:
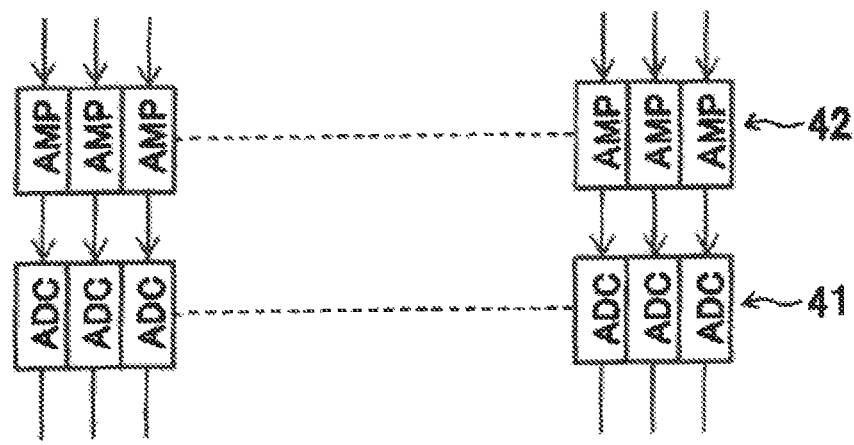
Figure 4C:
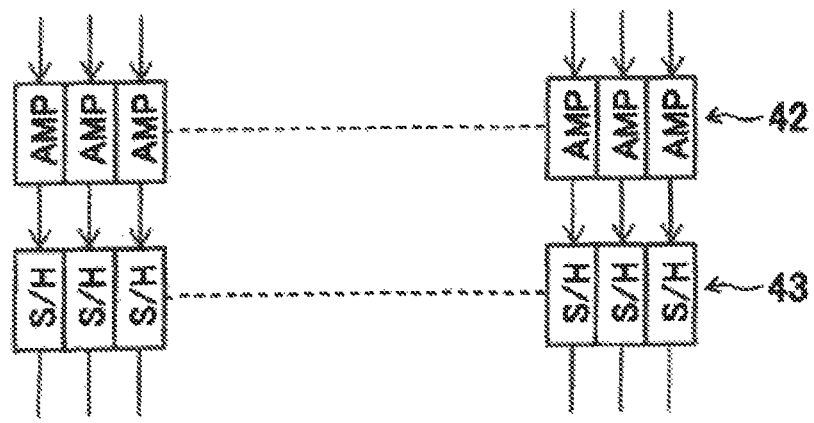

In this way, as shown in FIG. 4A for example, the reading circuit 40 may include ADCs 41 for converting the read-out signals VSL from the column outputs of the pixel part 20 into digital signals. Alternatively, as shown in FIG. 4B for example, the reading circuit 40 may include amplifiers (AMPs) 42 for amplifying the read-out signals VSL from the column outputs of the pixel part 20. It is also possible that, as shown in FIG. 4C for example, the reading circuit 40 may include sample/hold (S/H) circuits 43 for sampling/holding the read-out signals VSL from the column outputs of the pixel part 20.

The horizontal scanning circuit 50 scans the signals processed in the plurality of column signal processing circuits of the reading circuit 40 such as ADCs, transfers the signals in a horizontal direction, and outputs the signals to a signal processing circuit (not shown).

The timing control circuit 60 generates timing signals required for signal processing in the pixel part 20, the vertical scanning circuit 30, the reading circuit 40, the horizontal scanning circuit 50, and the like.

The above description outlined the configurations and functions of the parts of the solid-state imaging device 10. Next, a detailed description will be given of the configuration of the capacitance changing part 80, the configuration of the additional capacitance, and the reading process related thereto.

In the first embodiment, the capacitance changing part 80 includes binning switches (binning transistors).

Figure 5:
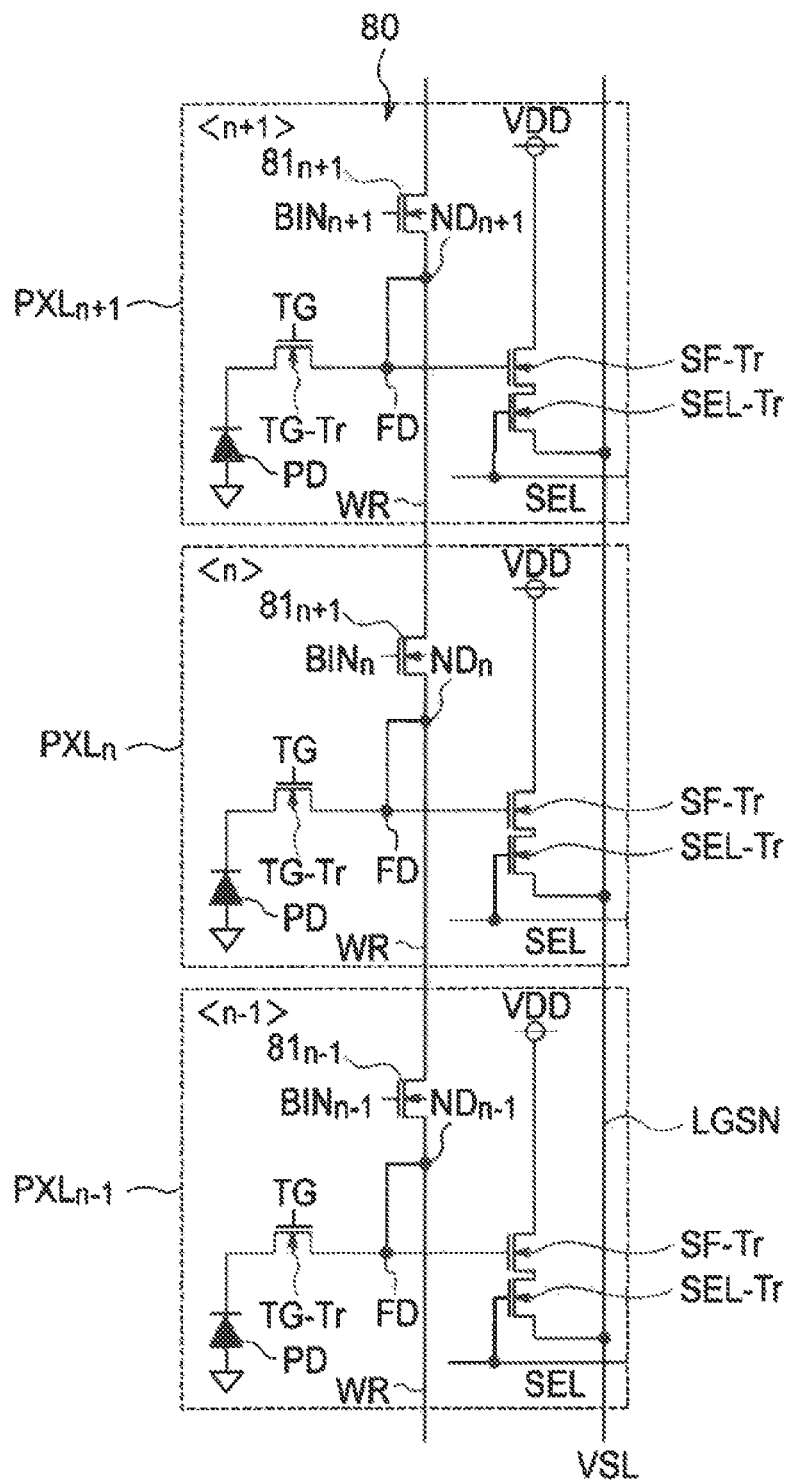
FIG. 5 shows an example configuration of the pixel part and a capacitance changing part according to the first embodiment of the present invention.

FIG. 5 shows an example configuration of the pixel part and the capacitance changing part according to the first embodiment of the present invention.

In the first embodiment, the capacitance changing part 80 is constituted by a first binning switch 81n−1, 81n, 81n+1 and a first binning switch (not shown), instead of a capacitor. The first binning switch 81n−1, 81n, 81n+1 is connected to (disposed on) the wire WR formed between the floating diffusions FD of a plurality of pixels PXLn−1, PXLn, PXLn+1 adjacent to each other in the column direction, and the first binning switch (not shown) is connected between the floating diffusion FD of the pixel PXLn+1 and the power supply line VDD.

In the first embodiment, the first binning switch 81 ( . . . n−1, n, n+1 . . . ) is constituted by an insulated gate field effect transistor such as an n-channel MOS (NMOS) transistor. In the following description, a binning switch may be referred to as a binning transistor. Also, a first binning transistor may be denoted by the sign BIN MC.

In the first embodiment, the first binning switches 81n−1, 81n, 81n+1 are switched between ON and OFF states by capacitance changing signals BINn−1, BINn, BINn+1, so as to change the number of connected floating diffusions FD to one or a plural number, change the capacitance of the floating diffusion FD of the pixel to be read, and change the conversion gain of the floating diffusion FD of the pixel PXLn or the pixel PXLn+1 to be read. Further, in the first embodiment, the first binning switch 81 is formed such that a parasitic capacitance (MOS capacitance) and a wire capacitance of the wire connected to the binning switch 81, each having a value in accordance with the ON or OFF state, are added to the capacitance of the floating diffusion FD of the pixel PXL to be read, so as to optimize the capacitance of the floating diffusion FD and optimally adjust the conversion gain in accordance with the mode.

In the first embodiment, a reset element is shared by all of pixels . . . PXLn−1, PXLn, PXLn+1 . . . in one column. For example, the floating diffusion FD of the PXL0 (not shown in FIG. 5) at one end of the column and the power supply line VDD (not shown in FIG. 5) formed in proximity to the pixel PXLN−1 at the other end of the column are connected to each other via the first binning transistors (switches) . . . 81n−1, 81n, 81n+1 . . . formed on the wire WR in cascaded connection so as to correspond to the pixels. The nodes . . . NDn−1, NDn, NDn+1 . . . on the wire WR between the first binning switches are connected to the floating diffusions FD of the pixels . . . PXLn−1, PXLn, PXLn+1 . . . , respectively. In the first embodiment, the first binning transistor (switch) 81N−1 (not shown) on the other end serves as the shared reset element.

With this configuration, the solid-state imaging device 10 of the first embodiment is capable of flexibly changing the number of connected floating diffusions FD, resulting in a high expandability of the dynamic range. Further, the solid-state imaging device 10 of the first embodiment is configured such that the capacitance of the floating diffusion FD can be optimally adjusted to obtain a desired optimal value of the conversion gain in accordance with the mode, and the SN ratio at the changing point of the conversion gain can be optimized to obtain desired output characteristics that result in a high image quality. Since the solid-state imaging device 10 of the first embodiment includes a small number of transistors in each pixel, it can have a high PD fill factor, high photoelectric conversion sensitivity, and a large number of saturated electrons.

A description is given of main additional capacitance components, each having a value in accordance with the ON or OFF state of the first binning transistor (binning switch) 81 and added to optimize the capacitance of the floating diffusion FD of the pixel PXL to be read and optimally adjust the conversion gain in accordance with the mode. A part of wiring for connection of a gate or a diffusion layer with an upper layer, called "a contact," is herein referred to as "a contact wire."

Figure 6:
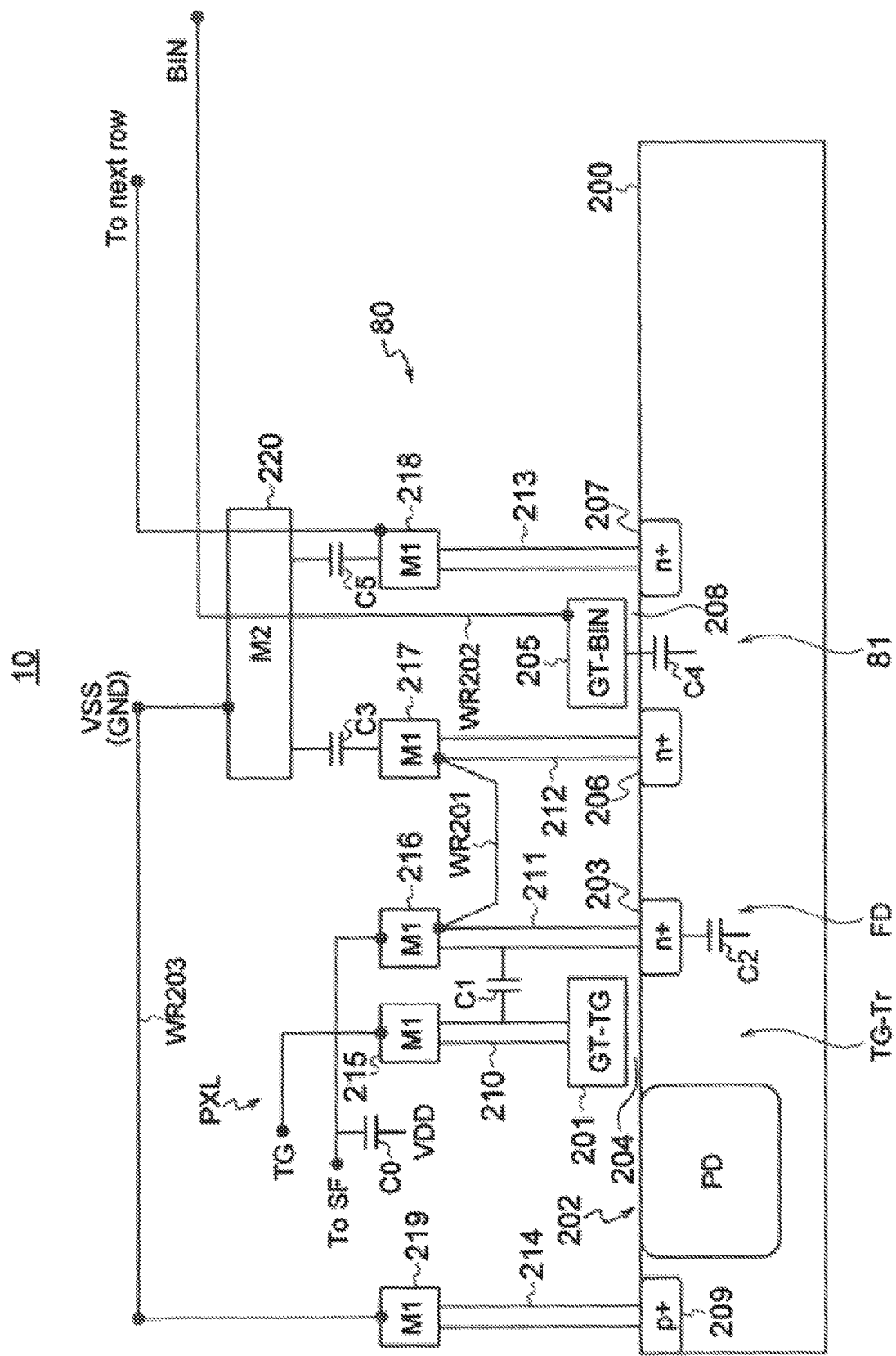
FIG. 6 is a simplified sectional view of a main part of the pixel and the capacitance changing part in the solid-state imaging device according to the first embodiment of the present invention.

FIG. 6 is a simplified sectional view of a main part of the pixel PXL and the capacitance changing part 80 in the solid-state imaging device 10 according to the first embodiment of the present invention, and FIG. 6 is used to illustrate additional capacitance components to be added to the capacitance of the floating diffusion FD.

The example shown in FIG. 6 includes the photodiode PD, the transfer transistor TG-Tr, the floating diffusion FD, and the first binning transistor (binning switch) 81 arranged in parallel in or above the front-side surface (one side surface) of a semiconductor substrate (which may hereinafter also be referred to simply as "the substrate") 200.

In the transfer transistor TG-Tr, a gate (GT-TG) 201 is formed above a channel forming region between one end side of a photoelectric conversion and charge storage region 202 of the photodiode PD that serves as a source/drain and an n+ diffusion layer 203 that serves as the floating diffusion FD, and a gate oxidation film 204 is interposed between the gate (GT-TG) 201 and the channel forming region.

The first binning transistor 81 includes a gate (GT-BIN) 205, and an n+ diffusion layer 206 on one side and an n+ diffusion layer 207 on the other side each serving as a source/drain. In the first binning transistor 81, the gate (GT-BIN) 205 is formed above a channel forming region between the n+ diffusion layer 206 and the n+ diffusion layer 207 each serving as a source/drain, and a gate oxidation film 208 is interposed between the gate (GT-BIN) 205 and the channel forming region.

On the other end side of the photoelectric conversion and charge storage region 202 of the photodiode PD in the substrate 200, there is formed a p+ diffusion layer 209 that serves as a connection electrode for connecting with a reference potential VSS (e.g., a ground potential GND).

The gate 201 of the transfer transistor TG-Tr, the n+ diffusion layer 203 forming the floating diffusion FD, the gate 205 forming the first binning transistor 81, the n+ diffusion layers 206, 207, and the p+ diffusion layer 209 that are formed in or above the substrate 200 are connected to one end (lower end) side of contact wires 210 to 214.

The gate 201 of the transfer transistor TG Tr is connected to a first contact wire 210 for transmitting a control signal TG to the transfer transistor TG-Tr as a charge transfer gate part.

The n+ diffusion layer 203 is connected to a second contact wire 211 for connecting the floating diffusion FD to a gate of the source follower transistor SF Tr as a source follower element.

The n+ diffusion layer 206 on the one side of the first binning transistor 81 is connected to a third contact wire 212 that is electrically connected via a wire WR201 to the second contact wire 211 connected to the floating diffusion FD.

The n+ diffusion layer 207 on the other side of the first binning transistor 81 is connected to a fourth contact wire 213 that is electrically connected to a pixel in the next row.

The p+ diffusion layer 209 is connected to a fifth contact wire 214 for connection with the reference potential VSS.

The gate 205 of the first binning transistor 81 is connected to a wire WR202 for transmitting a capacitance changing signal BIN.

The first contact wire 210 to the fifth contact wire 214 include a first metal wire 215 to a fifth metal wire 219, respectively, that serve as a first conductive layer (a first metal layer) M1. More specifically, the other end of the first contact wire 210 is connected to the first metal wire 215. The other end of the second contact wire 211 is connected to the second metal wire 216. The other end of the third contact wire 212 is connected to the third metal wire 217. The other end of the fourth contact wire 213 is connected to the fourth metal wire 218. The other end of the fifth contact wire 214 is connected to the fifth metal wire 219.

Further, there is formed a sixth metal wire 220 serving as a second conductive layer (second metal layer) M2 that is different from the first conductive layer M1. The second conductive layer M2 forms at least one wire that can form a capacitance with a wire of the first conductive layer (first metal layer) M1. In the example shown in FIG. 6, the sixth metal wire 220 as the second conductive layer (second metal layer) M2 is opposed to the third metal wire 217 and the fourth metal wire 218 among the first metal wire 215 to the fifth metal wire 219 so as to be able to form capacitances with the third metal wire 217 and the fourth metal wire 218. Further, the sixth metal wire 220 as the second conductive layer (second metal layer) M2 is connected to the fifth metal wire 219 of the first conductive layer (first metal layer) M1 via a wire WR203 connected to the reference potential VSS.

In the configuration of the pixel PXL and the capacitance changing part 80 shown in FIG. 6, the examples of the additional capacitance components to be added to the capacitance Cfd of the floating diffusion FD include the six capacitances C0 to C5 as follows.

The first is a gate capacitance C0 of the source follower transistor SF Tr as the source follower element. The second is an inter-wire capacitance C1 formed between the first contact wire 210 and the second contact wire 211. The third is a junction capacitance C2 in the n+ diffusion layer 203 that forms the floating diffusion FD. The fourth is an inter-wire capacitance C3 formed between the third metal wire 217 of the first conductive layer (first metal layer) M1 and the sixth metal wire 220 of the second conductive layer (second metal layer) M2. The fifth is a gate capacitance C4 of the first binning transistor 81. The sixth is an inter-wire capacitance C5 formed between the fourth metal wire 218 of the first conductive layer (first metal layer) M1 and the sixth metal wire 220 of the second conductive layer (second metal layer) M2.

In the first embodiment, the parasitic capacitances (such as MOS capacitance, junction capacitance, and gate capacitance) of the MOS transistors and the inter-wire capacitances, each having a value in accordance with the ON or OFF state of the first binning transistor 81, are added to the capacitance Cfd of the floating diffusion FD of the pixel PXL to be read. In this way, the solid-state imaging device 10 of the embodiment is configured such that the capacitance of the floating diffusion FD can be optimally adjusted to obtain a desired optimal value of the conversion gain in accordance with the mode. Thus, the SN ratio at the changing point of the conversion gain can be optimized to obtain desired output characteristics that result in a high image quality.

Figures 7, 8:
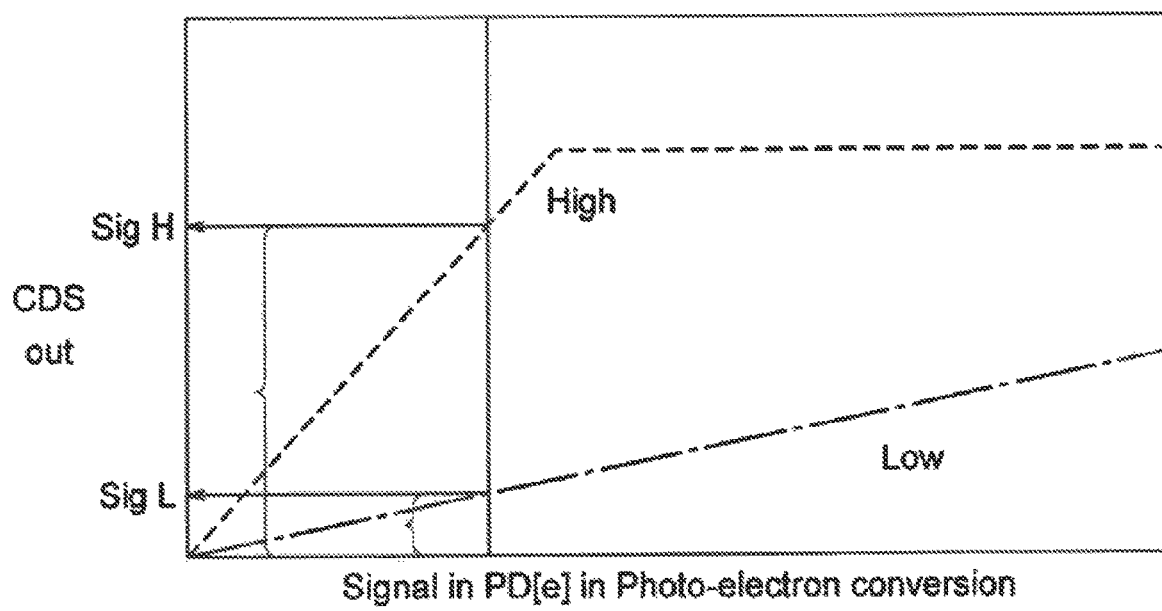
FIG. 7 shows a comparative relationship among the ON or OFF state of a first binning transistor, the conversion gain, and the adjusted total capacitance of the floating diffusion in the first embodiment.
FIG. 8 shows input and output characteristics of high gain signals and low gain signals in the solid-state imaging device according to the first embodiment of the present invention.

FIG. 7 shows a comparative relationship among the ON or OFF state of a first binning transistor 81, the conversion gain, and the adjusted total capacitance of the floating diffusion FD in the first embodiment.

In the first embodiment, when the first binning transistor 81 is in the OFF state, the conversion gain is high. In this case, added to the capacitance Cfd of the floating diffusion FD of the pixel PXL to be read are the gate capacitance C0 of the source follower transistor SF-Tr, the inter-wire capacitance C1 between the first contact wire 210 and the second contact wire 211, the junction capacitance C2 in the n+ diffusion layer 203 that forms the floating diffusion FD, and the inter-wire capacitance C3 between the third metal wire 217 of the first conductive layer (first metal layer) M1 and the sixth metal wire 220 of the second conductive layer (second metal layer) M2, totaling to an additional capacitance Cbin1 (=C0+C1+C2+C3). The first total capacitance of the floating diffusion FD for the high conversion gain is Cbin1.

In the first embodiment, when the first binning transistor 81 is in the ON state, the conversion gain is low. In this case, added to the capacitance Cfd of the floating diffusion FD of the pixel PXL to be read are the gate capacitance C0 of the source follower transistor SF-Tr, the inter-wire capacitance C1 between the first wire 210 and the second wire 211, the junction capacitance C2 in the n+ diffusion layer 203 that forms the floating diffusion FD, and the inter-wire capacitance C3 between the third metal wire 217 of the first conductive layer (first metal layer) M1 and the sixth metal wire 220 of the second conductive layer (second metal layer) M2, totaling to an additional capacitance Cbin1 (=C0+C1+C2+C3), and further added are the gate capacitance C4 of the first binning transistor 81, and the inter-wire capacitance C5 between the fourth metal wire 218 of the first conductive layer (first metal layer) M1 and the sixth metal wire 220 of the second conductive layer (second metal layer) M2, totaling to an additional capacitance Cbin2 (=C4+C5). The second total capacitance of the floating diffusion FD for the low conversion gain is Cbin1+Cbin2. Actually, in the case of the low conversion gain, the first total capacitance of the adjacent pixel PXLn+1 is added to the second total capacitance Cbin1+Cbin2.

Figure 9A:
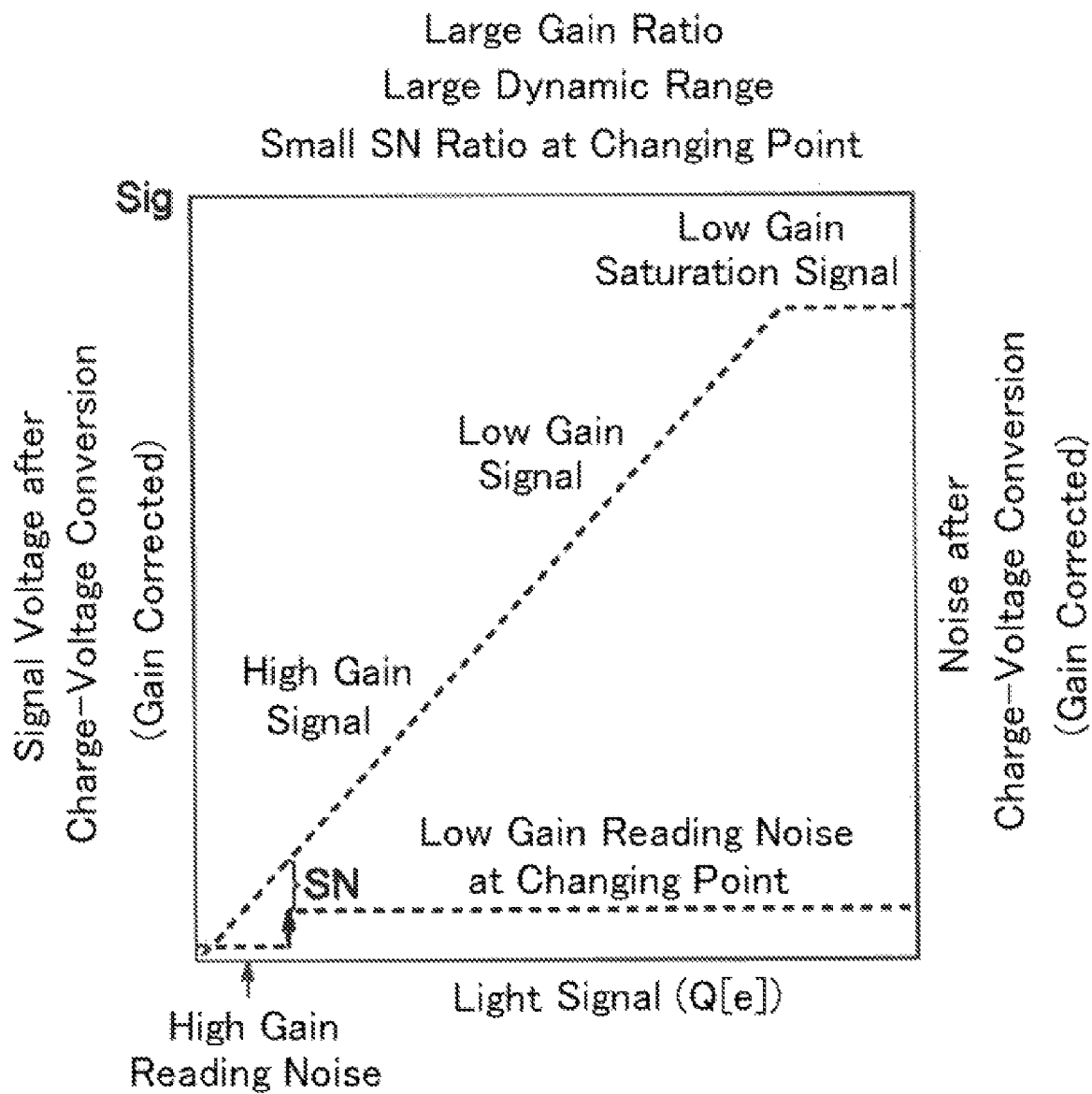
FIGS. 9A and 9B show input and output characteristics of high gain signals and low gain signals in a solid-state imaging device as a comparative example not accounting for the additional capacitance.
Figure 9B:
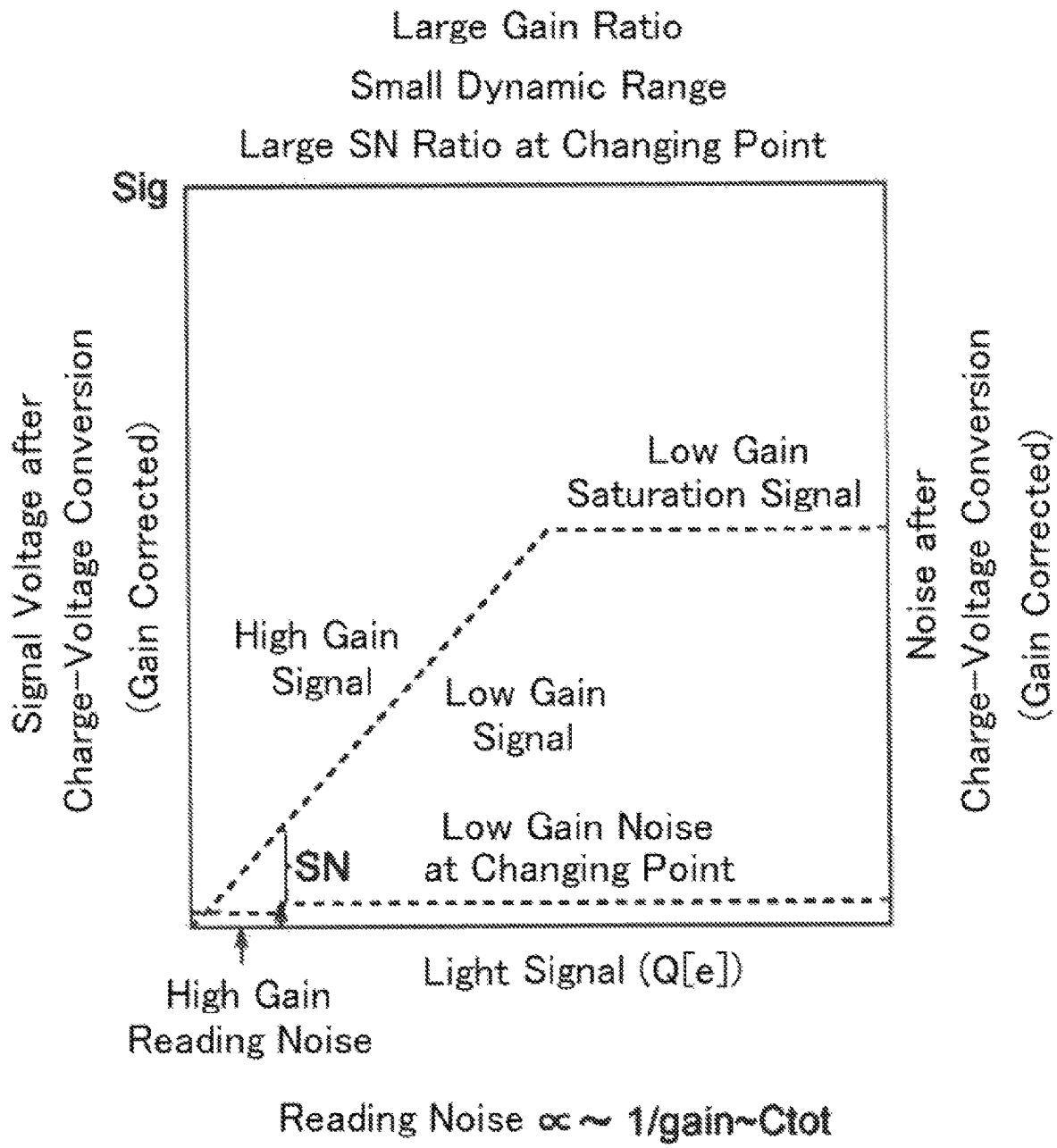

FIG. 8 shows input and output characteristics of high gain signals and low gain signals in the solid-state imaging device 10 according to the first embodiment of the present invention. FIGS. 9A and 9B show input and output characteristics of high gain signals and low gain signals in a solid-state imaging device as a comparative example not accounting for the additional capacitance. In FIGS. 8, 9A, and 9B, the abscissa represents (the quantity of charges produced by conversion of) the input light signal Q[e], and the ordinate represents the signal voltage Sig after the charge-voltage conversion. In FIGS. 9A and 9B, the ordinate on the left side represents the signal voltage Sig after the charge-voltage conversion, and the ordinate on the right side represents the noise after the charge-voltage conversion.

The signal voltage Sig and the conversion gain CG are given by the following expressions.

$$Sig=Q[e]/Ctot$$

$$CG=q/Ctot$$

In the solid-state imaging device of the comparative example, the dynamic range can be widened by increasing the number of the switches connected in series to the floating diffusion FD to increase the capacitance of the floating diffusion FD, which results in a large difference in conversion efficiency. However, particularly when the solid-state imaging device of the comparison example is designed such that, in one exposure period, the number of the connected switches is changed to change the conversion gain dynamically and the signals are read out for a plurality of times so as to enhance the dynamic range performance for videos, large noises may occur in switching the signals, as shown in FIGS. 9A and 9B, to degrade the SN ratio of the images including signals around the switching, unfavorably resulting in a low image quality.

By contrast, the solid-state imaging device 10 of the first embodiment is configured such that the capacitance of the floating diffusion FD can be optimally adjusted to obtain a desired optimal value of the conversion gain in accordance with the mode. Thus, as shown in FIG. 8, the SN ratio at the changing point of the conversion gain can be optimized to obtain desired output characteristics that result in a high image quality.

Figure 10:
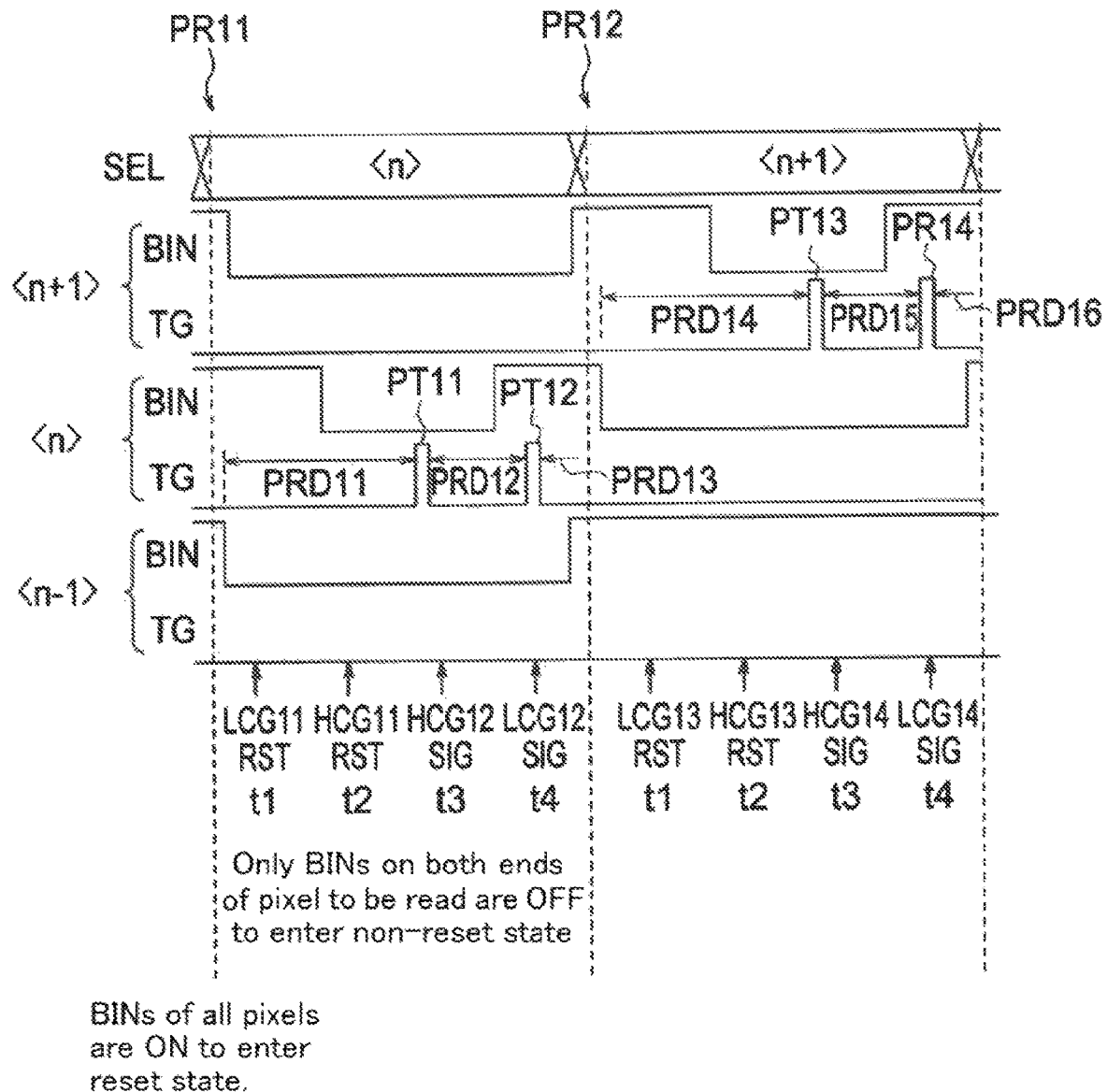
FIG. 10 is a timing chart illustrating an operation for achieving a wide dynamic range when a binning switch is applied to the capacitance changing part according to the first embodiment.

Next, with reference to FIG. 10, a description is given of an operation for achieving a wide dynamic range when a binning switch (binning transistor) is applied to the capacitance changing part according to the first embodiment.

FIG. 10 is a timing chart illustrating an operation for achieving a wide dynamic range when a binning switch (binning transistor) is applied to the capacitance changing part according to the first embodiment.

In the first embodiment, the capacitance changing signals corresponding to the pixels on both ends of the pixel to be read in the column direction are set to the L level, so as to enter a non-reset state. For example, the capacitance changing signals BINn−1, BINn+1 corresponding to the pixels PXLn−1, PXLn+1 on both ends of the pixel PXLn to be read in the column direction are set to the L level, so as to enter the non-reset state. For another example, the capacitance changing signals BINn, BINn+2 (not shown) corresponding to the pixels PXLn, PXLn+2 (not shown) on both ends of the pixel PXLn+1 to be read in the column direction are set to the L level, so as to enter the non-reset state.

However, this operation is a mere example. When a large number of floating diffusions are connected, the capacitance changing signals BIN corresponding to the directly adjacent pixels are not set to the L level, but the capacitance changing signals BIN corresponding to pixels at a distance of a plurality of rows (two or more rows) are set to the L level in accordance with the manner of the connection.

In the reading scan period PRDO, as shown in FIG. 10, the operation for selecting one row, e.g., the n-th row in a pixel array is performed by setting the control signal SEL connected to the pixels PXLn in the selected row to the H level to bring the selection transistors SEL Tr of the pixels PXLn into the conduction state. While the above selection is made, in a reset period PR11, all of the first binning transistors 81n−1, 81n, 81n+1 remain selected and in the conduction state during a period in which the capacitance changing signals BINn−1, BINn, BINn+1 as reset signals are at the H level, so that the floating diffusions FD are reset to the potential of the power supply line VDD. After the reset period PR11 has elapsed, the capacitance changing signals BINn−1, BINn+1 are switched to the L level, and the first binning transistors 81n−1, 81n+1 are switched to the non-conduction state. On the other hand, the capacitance changing signal BINn remains at the H level, and the first binning transistor 81n remains in the conduction state. When the first binning transistors 81n−1, 81n+1 are switched to the non-conduction state and the first binning transistor 81n remains in the conduction state, the reset period PR11 is ended, and the capacitance (quantity of charges) of the floating diffusion FD of the pixel PXLn is changed (increased) from the first total capacitance Cbin1 to the total capacitance value of the second total capacitance Cbin1+Cbin2 of the pixel PXLn and the first total capacitance of the adjacent pixel PXLn+1. A first reading period PRD11 then starts in which the pixel signals obtained during the reset state are read out. The first reading period PRD11 ends when the transfer period PT11 starts.

At the time t1 after the start of the first reading period PRD11, when the capacitance changing signal BINn remains at the H level, a first low conversion gain mode reading LCG11 is performed in which the reading part 70 reads pixel signals with a low conversion gain (second conversion gain) obtained by changing the capacitance (quantity of charges) of the floating diffusion FD to the total capacitance value of the second total capacitance of the pixel PXLn and the first total capacitance of the pixel PXLn+1. At this time, in each of the pixels PXLn, the source follower transistor SF-Tr outputs, to the vertical signal line LSGN, a read-out signal VSL (LCG11) of a column output obtained by converting the charges in the floating diffusion FD into a voltage signal with a gain corresponding to the quantity of the charges (potential). The read-out signal VSL (LCG11) is supplied to the reading circuit 40 and, for example, retained therein.

In the first reading period PRD11, after the first low conversion gain mode reading LCG11 performed at the time t1, the capacitance changing signal BINn is switched to the L (low) level, such that the capacitance (quantity of charges) of the floating diffusion FD is changed (reduced) from the second total capacitance Cbin1+Cbin2 to the first total capacitance Cbin1. Specifically, the capacitance of the floating diffusion FD is changed (reduced) to the first total capacitance of the pixel PXLn only, not having the first total capacitance of the adjacent pixel PXLn+1 added thereto.

At the time t2, a first high conversion gain mode reading HCG11 is performed in which the reading part 70 reads pixel signals with a high conversion gain (first conversion gain) obtained by changing the capacitance (quantity of charges) of the floating diffusion FD. At this time, in each of the pixels PXLn, the source follower transistor SF Tr outputs, to the vertical signal line LSGN, a read-out signal VSL (HCG11) of a column output obtained by converting the charges in the floating diffusion FD into a voltage signal with a gain corresponding to the quantity of the charges (potential). The read-out signal VSL (HCG11) is supplied to the reading circuit 40 and, for example, retained therein.

At this point, the first reading period PRD11 ends and a first transfer period PT11 starts. The capacitance changing signal BINn remains at the L level for a predetermined period subsequent to the first transfer period PT11 and until immediately before start of a second transfer period PT12. During the first transfer period PT11, the transfer transistor TG-Tr remains selected and in the conduction state in the period in which the control signal TG is at the high (H) level, so that the charges (electrons) produced by the photoelectric conversion and then stored in the photodiode PD are transferred to the floating diffusion FD. After the first transfer period PT11 has elapsed (or after the transfer transistor TG1-Tr is brought into the non-conduction state), a second reading period PRD12 starts, in which the pixel signals corresponding to the charges obtained by the photoelectric conversion and stored in the photodiode PD are read out.

At the time t3 after the start of the second reading period PRD12, when the capacitance changing signal BINn is set at the L level, a second high conversion gain mode reading HCG12 is performed in which the reading part 70 reads pixel signals with a high conversion gain (first conversion gain) obtained by setting the capacitance (quantity of charges) of the floating diffusion FD to the first total capacitance Cbin1. At this time, in each of the pixels PXLn, the source follower transistor SF Tr outputs, to the vertical signal line LSGN, a read-out signal VSL (HCG12) of a column output obtained by converting the charges in the floating diffusion FD into a voltage signal with a gain corresponding to the quantity of the charges (potential). The read-out signal VSL (HCG12) is supplied to the reading circuit 40 and, for example, retained therein.

In the second reading period PRD12, after the second high conversion gain mode reading HCG12 performed at the time t3, the capacitance changing signal BINn is switched to the H (high) level, such that the capacitance (quantity of charges) of the floating diffusion FD is changed (increased) from the first total capacitance Cbin1 to the total capacitance value of the second total capacitance Cbin1+Cbin2 of the pixel PXLn and the first total capacitance of the adjacent pixel PXLn+1. Substantially in parallel with this capacitance variation, the second transfer period PT12 starts. The capacitance changing signal BINn remains at the H level even after the second transfer period PT12 has elapsed. During the second transfer period PT12, the transfer transistor TG1-Tr remains selected and in the conduction state in the period in which the control signal TG is at the high (H) level, so that the charges (electrons) produced by the photoelectric conversion and then stored in the photodiode PD are transferred to the floating diffusion FD. After the second transfer period PT12 has elapsed (or after the transfer transistor TG-Tr is brought into the non-conduction state), a third reading period PRD13 starts, in which the pixel signals corresponding to the charges obtained by the photoelectric conversion and stored in the photodiode PD are further read out.

At the time t4 after the start of the third reading period PRD13, when the capacitance changing signal BINn remains at the H level, a second low conversion gain mode reading LCG12 is performed in which the reading part 70 reads pixel signals with a low conversion gain (second conversion gain) obtained by setting the capacitance (quantity of charges) of the floating diffusion FD to the total capacitance value of the second total capacitance of the pixel PXLn and the first total capacitance of the pixel PXLn+1. At this time, in each of the pixels PXLn, the source follower transistor SF-Tr outputs, to the vertical signal line LSGN, a read-out signal VSL(LCG12) of a column output obtained by converting the charges in the floating diffusion FD into a voltage signal with a gain corresponding to the quantity of the charges (potential). The read-out signal VSL(LCG12) is supplied to the reading circuit 40 and, for example, retained therein.

Additionally, the reading circuit 40, which constitutes part of, for example, the reading part 70, calculates the difference {VSL(HCG12)–VSL(HCG11)} between the read-out signal VSL(HCG12) of the second high conversion gain mode reading HCG12 and the read-out signal VSL(HCG11) of the first high conversion gain mode reading HCG11, and the reading circuit 40 performs the CDS. Likewise, the reading circuit 40 calculates the difference {VSL(LCG12)–VSL (LCG11)} between the read-out signal VSL(LCG12) of the second low conversion gain mode reading LCG12 and the read-out signal VSL(LCG11) of the first low conversion gain mode reading LCG11, and the reading circuit 40 performs the CDS.

Next, as shown in FIG. 10, the operation for selecting the row next to the n-th row, e.g., the n+1-th row in the pixel array is performed by setting the control signal SEL connected to the pixels PXLn+1 in the selected n+1-th row to the H level to bring the selection transistors SEL Tr of the pixels PXLn+1 into the conduction state. At this time, the capacitance changing signal BINn remains at the H level as when the n-th row was accessed. While the above selection is made, in a reset period PR12, all of the first binning transistors 81n−1, 81n, 81n+1 remain selected and in the conduction state during a period in which the capacitance changing signals BINn−1, BINn, BINn+1 as reset signals are at the H level, so that the floating diffusions FD are reset to the potential of the power supply line VDD. After the reset period PR12 has elapsed, the capacitance changing signal BINn is switched to the L level, and the first binning transistor 81n is switched to the non-conduction state. On the other hand, the capacitance changing signals BINn+1, BINn−1 remain at the H level, and the first binning transistors 81n+1, 81n−1 remain in the conduction state. When the first binning transistor 81n is switched to the non-conduction state and the first binning transistors 81n+1, 81n−1 remain in the conduction state, the reset period PR12 is ended, and the capacitance (quantity of charges) of the floating diffusion FD of the pixel PXLn+1 is changed (increased) from the first total capacitance Cbin1 to the total capacitance value of the second total capacitance Cbin1+Cbin2 of the pixel PXLn+1 and the first total capacitance of the adjacent pixel PXLn+2. A first reading period PRD14 then starts in which the pixel signals obtained during the reset state are read out. The first reading period PRD14 ends when the transfer period PT13 starts.

At the time t1 after the start of the first reading period PRD14, when the capacitance changing signal BINn+1 remains at the H level, a first low conversion gain mode reading LCG13 is performed in which the reading part 70 reads pixel signals with a low conversion gain (second conversion gain) obtained by changing the capacitance (quantity of charges) of the floating diffusion FD to the total capacitance value of the second total capacitance Cbin1+Cbin2 of the pixel PXLn+1 and the first total capacitance of the pixel PXLn+2. At this time, in each of the pixels PXLn+1, the source follower transistor SF-Tr outputs, to the vertical signal line LSGN, a read-out signal VSL(LCG13) of a column output obtained by converting the charges in the floating diffusion FD into a voltage signal with a gain corresponding to the quantity of the charges (potential). The read-out signal VSL(LCG13) is supplied to the reading circuit 40 and, for example, retained therein.

In the first reading period PRD14, after the first low conversion gain mode reading LCG13 performed at the time t1, the capacitance changing signal BINn+1 is switched to the L (low) level, such that the capacitance (quantity of charges) of the floating diffusion FD is changed (reduced) from the second total capacitance Cbin1+Cbin2 to the first total capacitance Cbin1. Specifically, the capacitance of the floating diffusion FD is changed (reduced) to the first total capacitance Ctot1 of the pixel PXLn+1 only, not having the first total capacitance of the adjacent pixel PXLn+2 added thereto. At the time t2, a first high conversion gain mode reading HCG13 is performed in which the reading part 70 reads pixel signals with a high conversion gain (first conversion gain) obtained by changing the capacitance (quantity of charges) of the floating diffusion FD. At this time, in each of the pixels PXLn+1, the source follower transistor SF Tr outputs, to the vertical signal line LSGN, a read-out signal VSL(HCG13) of a column output obtained by converting the charges in the floating diffusion FD into a voltage signal with a gain corresponding to the quantity of the charges (potential). The read-out signal VSL(HCG13) is supplied to the reading circuit 40 and, for example, retained therein.

At this point, the first reading period PRD14 ends and a first transfer period PT13 starts. The capacitance changing signal BINn+1 remains at the L level for a predetermined period subsequent to the first transfer period PT13 and until immediately before start of a second transfer period PT14. During the first transfer period PT13, the transfer transistor TG-Tr remains selected and in the conduction state in the period in which the control signal TG is at the high (H) level, so that the charges (electrons) produced by the photoelectric conversion and then stored in the photodiode PD are transferred to the floating diffusion FD. After the first transfer period PT13 has elapsed (or after the transfer transistor TG1-Tr is brought into the non-conduction state), a second reading period PRD15 starts, in which the pixel signals corresponding to the charges obtained by the photoelectric conversion and stored in the photodiode PD are read out.

At the time t3 after the start of the second reading period PRD15, when the capacitance changing signal BINn+1 is set at the L level, a second high conversion gain mode reading HCG14 is performed in which the reading part 70 reads pixel signals with a high conversion gain (first conversion gain) obtained by setting the capacitance (quantity of charges) of the floating diffusion FD to the first total capacitance Cbin1. At this time, in each of the pixels PXLn+1, the source follower transistor SF Tr outputs, to the vertical signal line LSGN, a read-out signal VSL(HCG14) of a column output obtained by converting the charges in the floating diffusion FD into a voltage signal with a gain corresponding to the quantity of the charges (potential). The read-out signal VSL(HCG14) is supplied to the reading circuit 40 and, for example, retained therein.

In the second reading period PRD15, after the second high conversion gain mode reading HCG14 performed at the time t3, the capacitance changing signal BINn+1 is switched to the H (high) level, such that the capacitance (quantity of charges) of the floating diffusion FD is changed (increased) from the first total capacitance Cbin1 to the total capacitance value of the second total capacitance Cbin1+Cbin2 of the pixel PXLn+1 and the first total capacitance of the adjacent pixel PXLn+2. Substantially in parallel with this capacitance variation, the second transfer period PT14 starts. The capacitance changing signal BINn+1 remains at the H level even after the second transfer period PT14 has elapsed. During the second transfer period PT14, the transfer transistor TG-Tr remains selected and in the conduction state in the period in which the control signal TG is at the high (H) level, so that the charges (electrons) produced by the photoelectric conversion and then stored in the photodiode PD are transferred to the floating diffusion FD. After the second transfer period PT14 has elapsed (or after the transfer transistor TG-Tr is brought into the non-conduction state), a third reading period PRD16 starts, in which the pixel signals corresponding to the charges obtained by the photoelectric conversion and stored in the photodiode PD are further read out.

At the time t4 after the start of the third reading period PRD16, when the capacitance changing signal BINn+1 remains at the H level, a second low conversion gain mode reading LCG14 is performed in which the reading part 70 reads pixel signals with a low conversion gain (second conversion gain) obtained by setting the capacitance (quantity of charges) of the floating diffusion FD to the total capacitance value of the second total capacitance Cbin1+Cbin2 of the pixel PXLn+1 and the first total capacitance of the pixel PXLn+2. At this time, in each of the pixels PXLn+1, the source follower transistor SF Tr outputs, to the vertical signal line LSGN, a read-out signal VSL(LCG14) of a column output obtained by converting the charges in the floating diffusion FD into a voltage signal with a gain corresponding to the quantity of the charges (potential). The read-out signal VSL(LCG14) is supplied to the reading circuit 40 and, for example, retained therein.

Additionally, the reading circuit 40, which constitutes part of, for example, the reading part 70, calculates the difference {VSL(HCG14)−VSL(HCG13)} between the read-out signal VSL(HCG14) of the second high conversion gain mode reading HCG14 and the read-out signal VSL(HCG13) of the first high conversion gain mode reading HCG13, and the reading circuit 40 performs the CDS. Likewise, the reading circuit 40 calculates the difference {VSL(LCG14)−VSL(LCG13)} between the read-out signal VSL(LCG14) of the second low conversion gain mode reading LCG14 and the read-out signal VSL(LCG13) of the first low conversion gain mode reading LCG13, and the reading circuit 40 performs the CDS.

As described above, in the solid-state imaging device 10 according to the first embodiment, the first binning switches 81n−1, 81n, 81n+1 are switched between ON and OFF states by capacitance changing signals BINn−1, BINn, BINn+1, so as to change the number of connected floating diffusions FD to one or a plural number, change the capacitance of the floating diffusion FD of the pixel to be read, and change the conversion gain of the floating diffusion FD of the pixel PXLn or the pixel PXLn+1 to be read. Further, in the solid-state imaging device 10 according to the first embodiment, the first binning switch 81 is formed such that a parasitic capacitance (MOS capacitance) and a wire capacitance of the wire connected to the binning switch 81, each having a value in accordance with the ON or OFF state, are added to the capacitance of the floating diffusion FD of the pixel PXL to be read, so as to optimize the capacitance of the floating diffusion FD and optimally adjust the conversion gain in accordance with the mode.

In this way, the solid-state imaging device 10 of the first embodiment is configured such that the capacitance of the floating diffusion FD can be optimally adjusted to obtain a desired optimal value of the conversion gain in accordance with the mode, and the SN ratio at the changing point of the conversion gain can be optimized to obtain desired output characteristics that result in a high image quality. Further, it is possible to reduce the noise and improve the sensitivity while increasing the storage capacitance and widen the dynamic range without degrading the optical characteristics.

According to the first embodiment, it is possible to output both bright signals and dark signals by switching, in a single reading period, the interior of the pixels between a high conversion gain mode and a low conversion gain mode for outputting signals generated from the charges (electrons) produced by the photoelectric conversion in a single storage period (exposure period), cancel the reset noise in the high conversion gain mode and the low conversion gain mode, and widen the dynamic range while suppressing distortion due to a moving subject, thereby to achieve a high image quality.

Further, according to the first embodiment, it is possible to flexibly change the number of connected floating diffusions FD, resulting in a high expandability of the dynamic range. Since the solid-state imaging device 10 of the first embodiment includes a small number of transistors in each pixel, it can have a high PD fill factor, high photoelectric conversion sensitivity, and a large number of saturated electrons.

Second Embodiment

Figure 11:
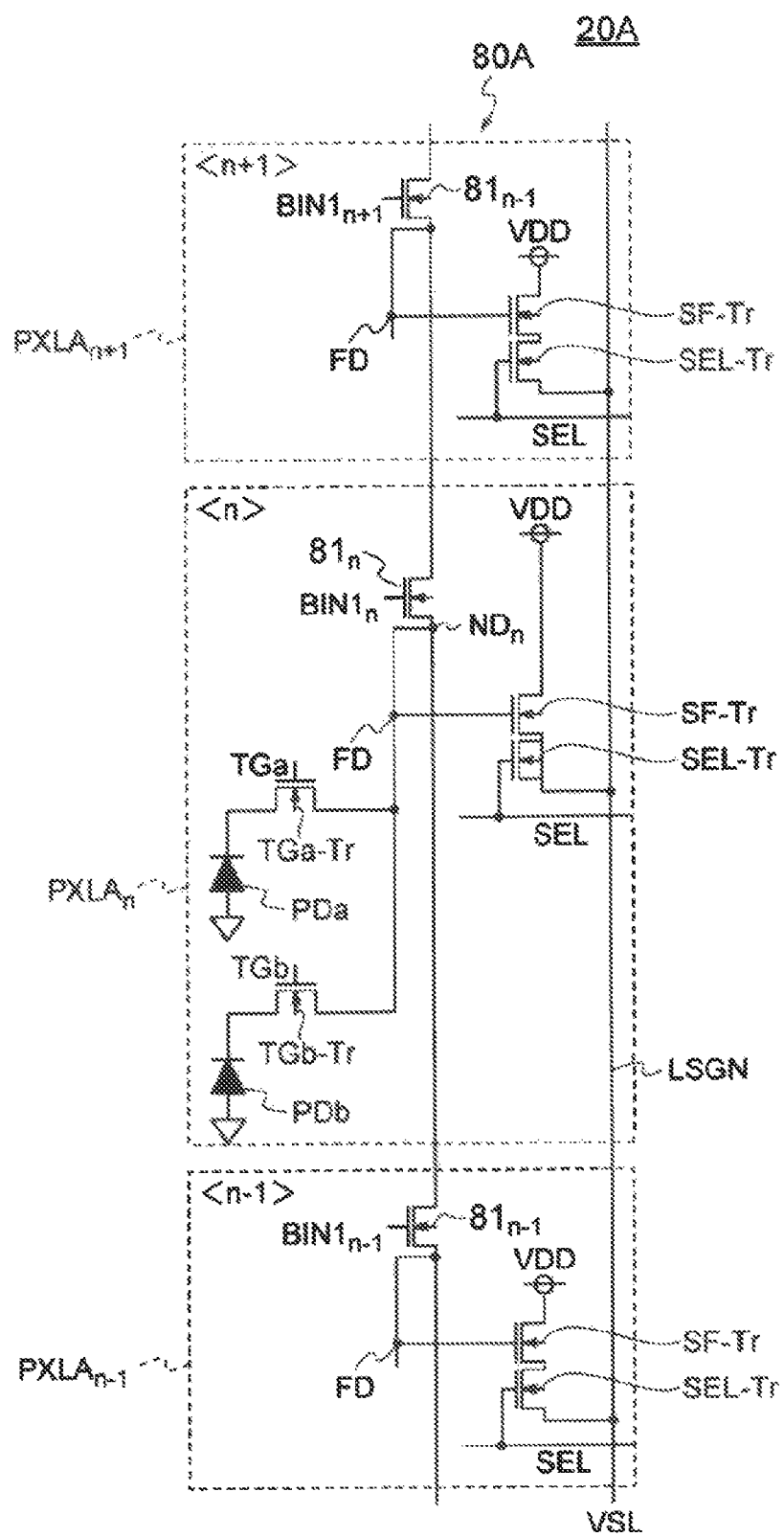
FIG. 11 shows an example configuration of the pixel part and the capacitance changing part according to the second embodiment of the present invention.

FIG. 11 shows an example configuration of the pixel part and the capacitance changing part according to a second embodiment of the present invention.

The pixel PXLA and the capacitance changing part 80A of the second embodiment differ from the pixel PXL and the capacitance changing part 80 of the first embodiment in the following point.

As shown in FIG. 11, the solid-state imaging device 10A according to the second embodiment has a pixel-sharing structure in which one floating diffusion FD is shared by a plurality (e.g., two as in this example) of photodiodes PDa, PDb and transfer transistors TGa-Tr, TGb-Tr.

The second embodiment can produce the same effects as the first embodiment described above.

Third Embodiment

Figure 12:
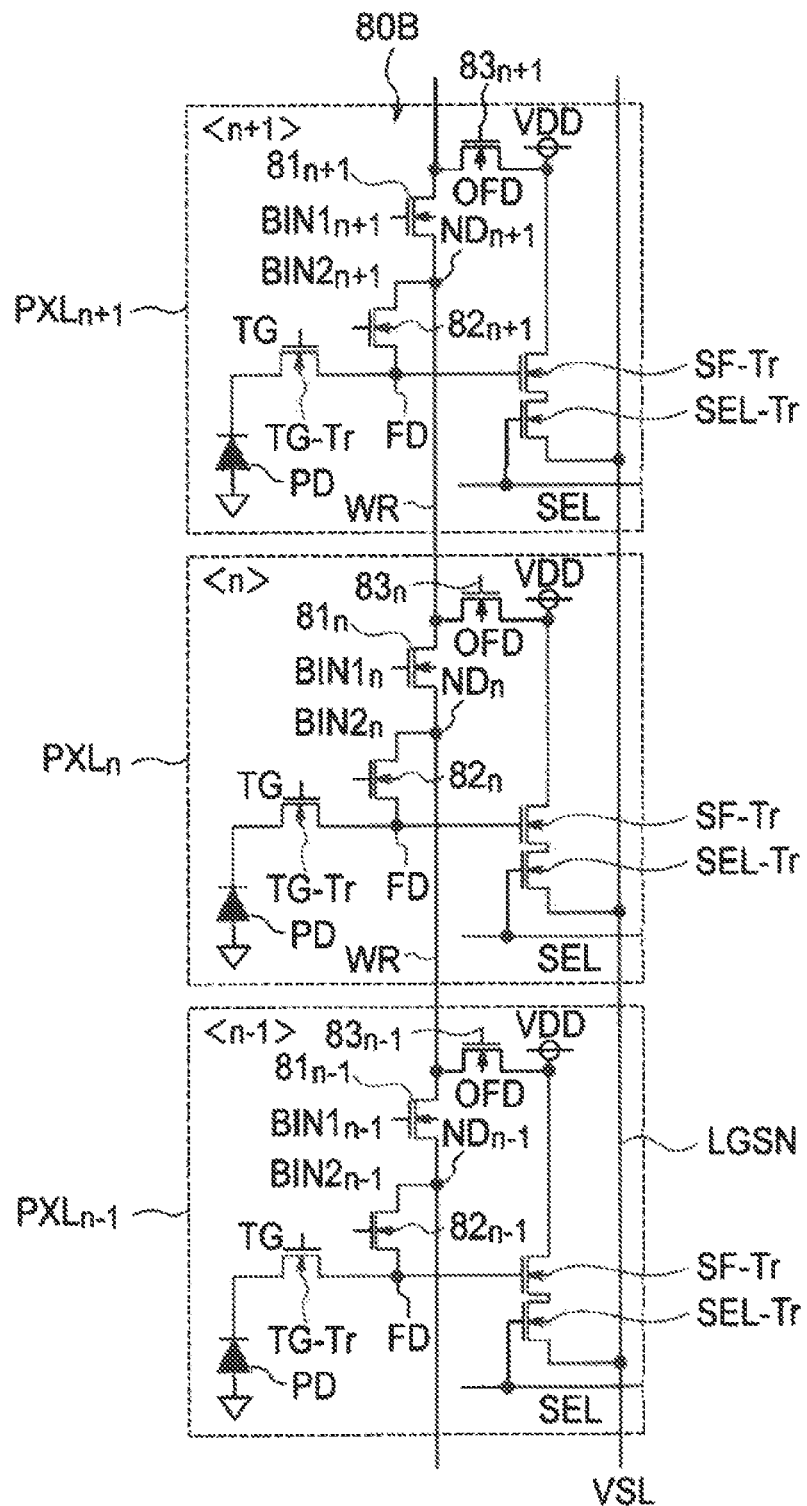
FIG. 12 shows an example configuration of the pixel part and the capacitance changing part according to the third embodiment of the present invention.

FIG. 12 shows an example configuration of the pixel part and the capacitance changing part according to a third embodiment of the present invention.

The capacitance changing part 80B of the third embodiment differs from the capacitance changing part 80 of the first embodiment in the following point. In the third embodiment, in addition to the first binning transistors (binning switches) 81n−1, 81n, 81n+1, which are formed on the wire WR in cascaded connection so as to correspond to the pixels, second binning transistors (binning switches) 82n−1, 82n, 82n+1 formed of, for example, NMOS transistors are connected between the floating diffusions FD of the pixels PXLn−1, PXLn, PXLn+1 and the nodes NDn−1, NDn, NDn+1 of the wire WR, respectively.

The first binning transistors 81n−1, 81n, 81n+1 are brought into the ON or OFF state selectively by the first capacitance changing signals BIN1n−1, BIN1n, BIN1n+1, respectively, and the second binning transistors 82n−1, 82n, 82n+1 are brought into the ON or OFF state selectively by the second capacitance changing signals BIN2n−1, BIN2n, BIN2n+1, respectively. In the third embodiment, the first capacitance changing signals BIN1n−1, BIN1n, BIN1n+1 are paired with the second capacitance changing signals BIN2n−1, BIN2n, BIN2n+1, respectively, and each pair is switched to the H level or the L level at the same timing (in phase).

In this configuration, the first binning transistors 81n−1, 81n, 81n+1 are used for connection and disconnection of the FD wire WR adjacent thereto. The second binning transistors 82n−1, 82n, 82n+1 are disposed in the vicinity of the transfer transistors TG-Tr of the pixels PXLn−1, PXLn, PXLn+1, respectively, and are used to minimize the parasitic capacitance of the floating diffusion FD nodes in the high conversion gain mode.

Further, in the capacitance changing part 80B according to the third embodiment, the pixels PXLn−1, PXLn, PXLn+1 include overflow drain (OFD) gates 83n−1, 83n, 83n+1, respectively, each connected between the power supply line VDD and a connection portion for connection with the adjacent pixel disposed above associated one of the first binning transistors 81n−1, 81n, 81n+1.

Each of the OFD gates 83n−1, 83n, 83n+1 discharges overflow electrons to the power supply line (terminal) such that when the light brightness is high, electrons (charges) overflowing from the photodiode PD to the floating diffusion FD may not leak to the adjacent pixel.

The voltage of the OFD gates 83n−1, 83n, 83n+1 can be set to be higher than the L level voltages of the first capacitance changing signals BIN1n−1, BIN1n, BIN1n+1 and the second capacitance changing signals BIN2n−1, BIN2n, BIN2n+1, so as to prevent that the electrons (charges) overflowing from the photodiodes PD cause the potential of the floating diffusions FD of the adjacent pixels to be reduced.

The OFD gates 83n−1, 83n, 83n+1 may be used for resetting. As compared to the configuration including reset elements and binning switches, a smaller number of elements are connected to the floating diffusions, resulting in better characteristics for high conversion gains.

In the following description, the first binning transistors may be denoted by the signal BIN_MC, and the second binning transistors may be denoted by the signal BIN_FD.

Further, in the third embodiment, the first binning transistor 81 and the second binning transistor 82 are formed such that a parasitic capacitance (MOS capacitance) and a wire capacitance of the wire connected to the binning transistors 81, 82, each having a value in accordance with the ON or OFF state, are added to the capacitance of the floating diffusion FD of the pixel PXL to be read, so as to optimize the capacitance of the floating diffusion FD and optimally adjust the conversion gain in accordance with the mode.

As described above, in the third embodiment, each pixel includes two binning transistors, the first binning transistor 81 and the second binning transistor 82, so as to change the capacitance of the floating diffusion FD. This configuration provides the third total capacitance Ctot13 that produces the middle conversion gain having a value between the high conversion gain and the low conversion gain, in addition to the first total capacitance Ctot11 that produces the high conversion gain and the second total capacitance Ctot12 that produces the low conversion gain.

In this configuration, although pixel signals can be read in the middle conversion gain reading mode, it is also possible that the reading with the middle conversion gain is substituted for the reading with the high conversion gain or the reading with the low conversion gain to perform the high conversion gain reading or the low conversion gain reading.

With this configuration, the solid-state imaging device 10B of the third embodiment is capable of flexibly changing the capacitances of the floating diffusions FD and the number of connected floating diffusions FD, resulting in a high expandability of the dynamic range. Further, the solid-state imaging device 10B of the third embodiment is configured such that the capacitance of the floating diffusion FD can be optimally adjusted to obtain a desired optimal value of the conversion gain in accordance with the mode, and the SN ratio at the changing point of the conversion gain can be optimized to obtain desired output characteristics that result in a high image quality.

A description is given of main additional capacitance components, each having a value in accordance with the ON or OFF state of the first binning transistor (binning switch) 81 and the second binning transistor (binning switch) 82 and added to optimize the capacitance of the floating diffusion FD of the pixel PXL to be read and optimally adjust the conversion gain in accordance with the mode. A part of wiring for connection of a gate or a diffusion layer with an upper layer, called "a contact," is herein referred to as "a contact wire."

Figure 13:
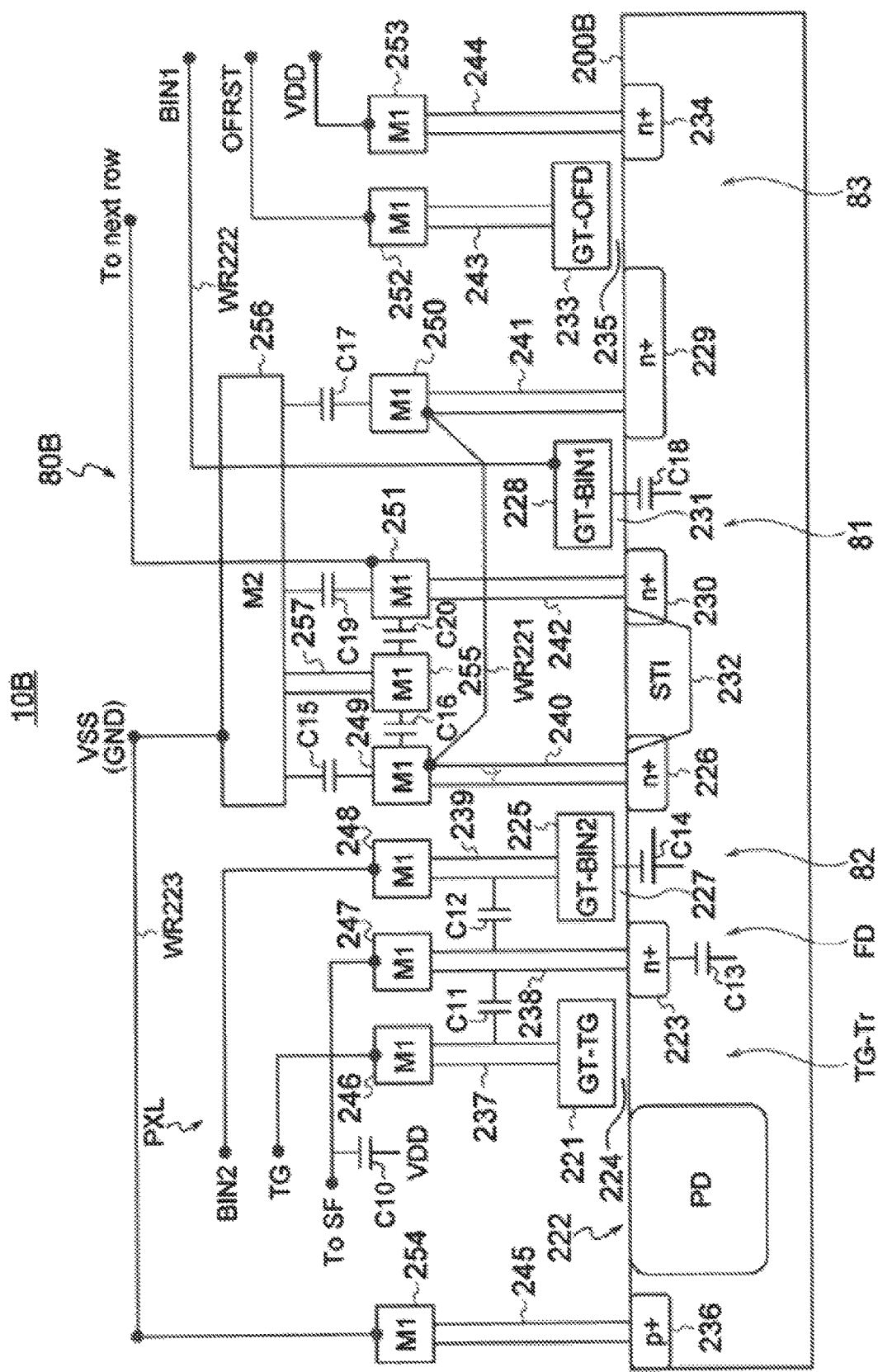
FIG. 13 is a simplified sectional view of a main part of the pixel and the capacitance changing part in the solid-state imaging device according to the third embodiment of the present invention.

FIG. 13 is a simplified sectional view of a main part of the pixel PXL and the capacitance changing part 80B in the solid-state imaging device 10B according to the third embodiment of the present invention, and FIG. 13 is used to illustrate additional capacitance components to be added to the capacitance of the floating diffusion FD.

The example shown in FIG. 13 includes a photodiode PD, a transfer transistor TG-Tr, a floating diffusion FD, a second binning transistor (binning switch) 82, a first binning transistor (binning switch) 81, and the OFD gate 83 arranged in parallel in or above the front-side surface (one side surface) of a semiconductor substrate (which may hereinafter also be referred to simply as "the substrate") 200B.

In the transfer transistor TG-Tr, a gate (GT-TG) 221 is formed above a channel forming region between one end side of a photoelectric conversion and charge storage region 222 of the photodiode PD that serves as a source/drain and an n+ diffusion layer 223 that serves as the floating diffusion FD, and a gate oxidation film 224 is interposed between the gate (GT-TG) 221 and the channel forming region.

The second binning transistor 82 includes a gate (GT-BIN2) 225, and an n+ diffusion layer 223 on one side and an n+ diffusion layer 226 on the other side each serving as a source/drain. In the second binning transistor 82, the gate (GT-BIN2) 225 is formed above the floating diffusion FD and a channel forming region between the n+ diffusion layer 223 and the n+ diffusion layer 226 each serving as a source/drain, and a gate oxidation film 227 is interposed between the gate (GT-BIN2) 225, and the floating diffusion FD and the channel forming region.

The first binning transistor 81 includes a gate (GT-BIN1) 228, and an n+ diffusion layer 229 on one side and an n+ diffusion layer 230 on the other side each serving as a source/drain. In the first binning transistor 81, the gate (GT-BIN1) 228 is formed above a channel forming region between the n+ diffusion layer 229 and the n+ diffusion layer 230 each serving as a source/drain, and a gate oxidation film 231 is interposed between the gate (GT-BIN1) 228 and the channel forming region. By way of an example, an element separation region (STI) 232 is formed between the n+ diffusion layer 226 on the other side of the second binning switch 82 and the n+ diffusion layer 230 on the other side of the first binning transistor 81.

The OFD gate 83 includes a gate (GT-OFD) 233, and an n+ diffusion layer 229 on one side and an n+ diffusion layer 234 on the other side each serving as a source/drain. In the OFD gate 83, the gate (GT-OFD) 233 is formed above a channel forming region between the n+ diffusion layer 229 and the n+ diffusion layer 234 each serving as a source/drain, and a gate oxidation film 235 is interposed between the gate (GT-OFD) 233 and the channel forming region.

On the other end side of the photoelectric conversion and charge storage region 222 of the photodiode PD in the substrate 200B, there is formed a p+ diffusion layer 236 that serves as a connection electrode for connecting with a reference potential VSS (e.g., a ground potential GND).

The gate 221 of the transfer transistor TG-Tr, the n+ diffusion layer 223 forming the floating diffusion FD, the gate 225 and the n+ diffusion layer 226 forming the second binning switch 82, the n+ diffusion layers 229, 230 forming the first binning transistor 81, the gate 233 and the n+ diffusion layer 234 forming the OFD gate 83, and the p+ diffusion layer 236 that are formed in or above the substrate 200B are connected to one end (lower end) side of contact wires 237 to 245.

The gate 221 of the transfer transistor TG Tr is connected to a first contact wire 237 for transmitting a control signal TG to the transfer transistor TG-Tr as a charge transfer gate part.

The n+ diffusion layer 223 is connected to a second contact wire 238 for connecting the floating diffusion FD to a gate of the source follower transistor SF Tr as a source follower element.

The gate 225 of the second binning transistor 82 is connected to a third contact wire 239 for transmitting the second capacitance changing signal BIN2 to the second binning transistor 82.

The n+ diffusion layer 226 on the other side of the second binning transistor 82 is connected to a fourth contact wire 240 that is electrically connected via a wire WR211 to a fifth contact wire 241 connected to the diffusion layer 229 on one side of the first binning transistor 81.

The n+ diffusion layer 229 on one side of the first binning transistor 81 is connected to the fifth contact wire 241.

The n+ diffusion layer 230 on the other side of the first binning transistor 81 is connected to a sixth contact wire 242 that is electrically connected to a pixel in the next row.

The gate 233 of the OFD gate 83 is connected to a seventh contact wire 243 for transmitting a control signal OFRST to the gate 233.

The n+ diffusion layer 234 on the other side of the OFD gate 83 is connected to an eighth contact wire 244 for connection with the power supply potential VDD.

The p+ diffusion layer 236 is connected to a ninth contact wire 245 for connection with the reference potential VSS.

The gate 228 of the first binning transistor 81 is connected to a wire WR222 for transmitting a capacitance changing signal BIN1.

The first contact wire 237 to the ninth contact wire 245 include a first metal wire 246 to a ninth metal wire 254, respectively, that serve as a first conductive layer (a first metal layer) M1. More specifically, the other end of the first contact wire 237 is connected to the first metal wire 246. The other end of the second contact wire 238 is connected to the second metal wire 247. The other end of the third contact wire 239 is connected to the third metal wire 248. The other end of the fourth contact wire 240 is connected to the fourth metal wire 249. The other end of the fifth contact wire 241 is connected to the fifth metal wire 250. The other end of the sixth contact wire 242 is connected to the sixth metal wire 251. The other end of the seventh contact wire 243 is connected to the seventh metal wire 252. The other end of the eighth contact wire 244 is connected to the eighth metal wire 253. The other end of the ninth contact wire 245 is connected to the ninth metal wire 254.

In the example shown in FIG. 13, a tenth metal wire 255 is disposed (formed) between the fourth metal wire 249 and the sixth metal wire 251.

Further, there is formed an eleventh metal wire 256 serving as a second conductive layer (second metal layer) M2 that is different from the first conductive layer M1. The second conductive layer M2 forms at least one wire that can form a capacitance with a wire of the first conductive layer (first metal layer) M1. In the example shown in FIG. 13, the eleventh metal wire 256 of the second conductive layer (second metal layer) M2 and the tenth metal wire 255 of the first conductive layer (first metal layer) M1 are connected to each other via a tenth contact wire 257. In the example shown in FIG. 13, the eleventh metal wire 256 as the second conductive layer (second metal layer) M2 is opposed to the fourth metal wire 249, the fifth metal wire 250, and the sixth metal wire 251 (and the tenth metal wire 255) among the first metal wire 246 to the tenth metal wire 255 so as to be able to form capacitances with these metal wires. Further, the eleventh metal wire 256 as the second conductive layer (second metal layer) M2 is connected to the ninth metal wire 254 of the first conductive layer (first metal layer) M1 via a wire WR223 connected to the reference potential VSS.

In the configuration of the pixel PXL and the capacitance changing part 80B shown in FIG. 13, the examples of the additional capacitance components to be added to the capacitance Cfd of the floating diffusion FD include the eleven capacitances C10 to C20 as follows.

The first is a gate capacitance C10 of the source follower transistor SF-Tr as the source follower element. The second is an inter-wire capacitance C11 formed between the first contact wire 237 and the second contact wire 238. The third is an inter-wire capacitance C12 formed between the second contact wire 238 and the third contact wire 239. The fourth is a junction capacitance C13 in the n+ diffusion layer 223 that forms the floating diffusion FD. The fifth is a gate capacitance C14 of the second binning transistor 82. The sixth is an inter-wire capacitance C15 formed between the fourth metal wire 249 of the first conductive layer (first metal layer) M1 and the eleventh metal wire 256 of the second conductive layer (second metal layer) M2. The seventh is an inter-wire capacitance C16 formed between the fourth metal wire 249 of the first conductive layer (first metal layer) M1 and the tenth metal wire 255. The eighth is an inter-wire capacitance C17 formed between the fifth metal wire 250 of the first conductive layer (first metal layer) M1 and the eleventh metal wire 256 of the second conductive layer (second metal layer) M2. The ninth is a gate capacitance C18 of the first binning transistor 81. The tenth is an inter-wire capacitance C19 formed between the sixth metal wire 251 of the first conductive layer (first metal layer) M1 and the eleventh metal wire 256 of the second conductive layer (second metal layer) M2. The eleventh is an inter-wire capacitance C20 formed between the sixth metal wire 251 of the first conductive layer (first metal layer) M1 and the tenth metal wire 255.

In the third embodiment, the parasitic capacitances (such as MOS capacitance, junction capacitance, and gate capacitance) of the MOS transistors and the inter-wire capacitances, each having a value in accordance with the ON or OFF state of the first binning transistor 81 and the second binning transistor 82, are added to the capacitance Cfd of the floating diffusion FD of the pixel PXL to be read. In this way, the solid-state imaging device 10B of the third embodiment is configured such that the capacitance of the floating diffusion FD can be optimally adjusted to obtain a desired optimal value of the conversion gain in accordance with the mode. Thus, the SN ratio at the changing point of the conversion gain can be optimized to obtain desired output characteristics that result in a high image quality.

FIG. 14 shows a comparative relationship among the ON or OFF states of the first binning transistor (switch) 81 and the second binning transistor (switch) 82, the conversion gain, and the adjusted total capacitance of the floating diffusion FD in the third embodiment.

Figure 15:
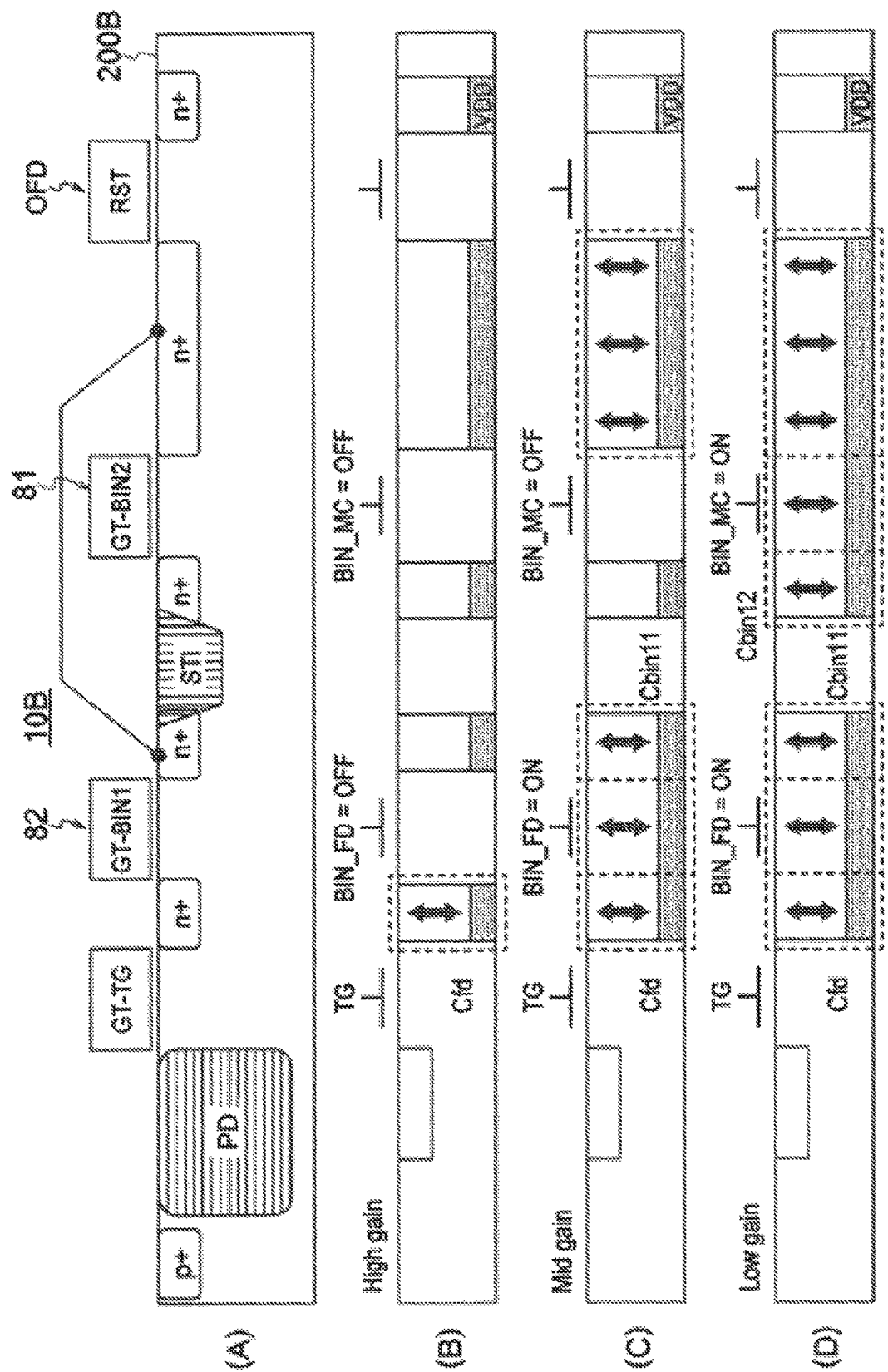
FIG. 15 shows a relationship among the ON or OFF states of the first binning transistor and the second binning transistor, the conversion gain, and the adjusted total capacitance of the floating diffusion in the third embodiment, in association with a transition state of potential.

FIG. 15 shows a relationship among the ON or OFF states of the first binning transistor (switch) 81 and the second binning transistor (switch) 82, the conversion gain, and the adjusted total capacitance of the floating diffusion FD in the third embodiment, in association with a transition state of potential. Part (A) of FIG. 15 is a simplified sectional view of a main part of the pixel and the capacitance changing part 80. Part (B) of FIG. 15 represents the state of high conversion gain, Part (C) of FIG. 15 represents the state of middle conversion gain, and Part (D) of FIG. 15 represents the state of low conversion gain.

Figure 16:
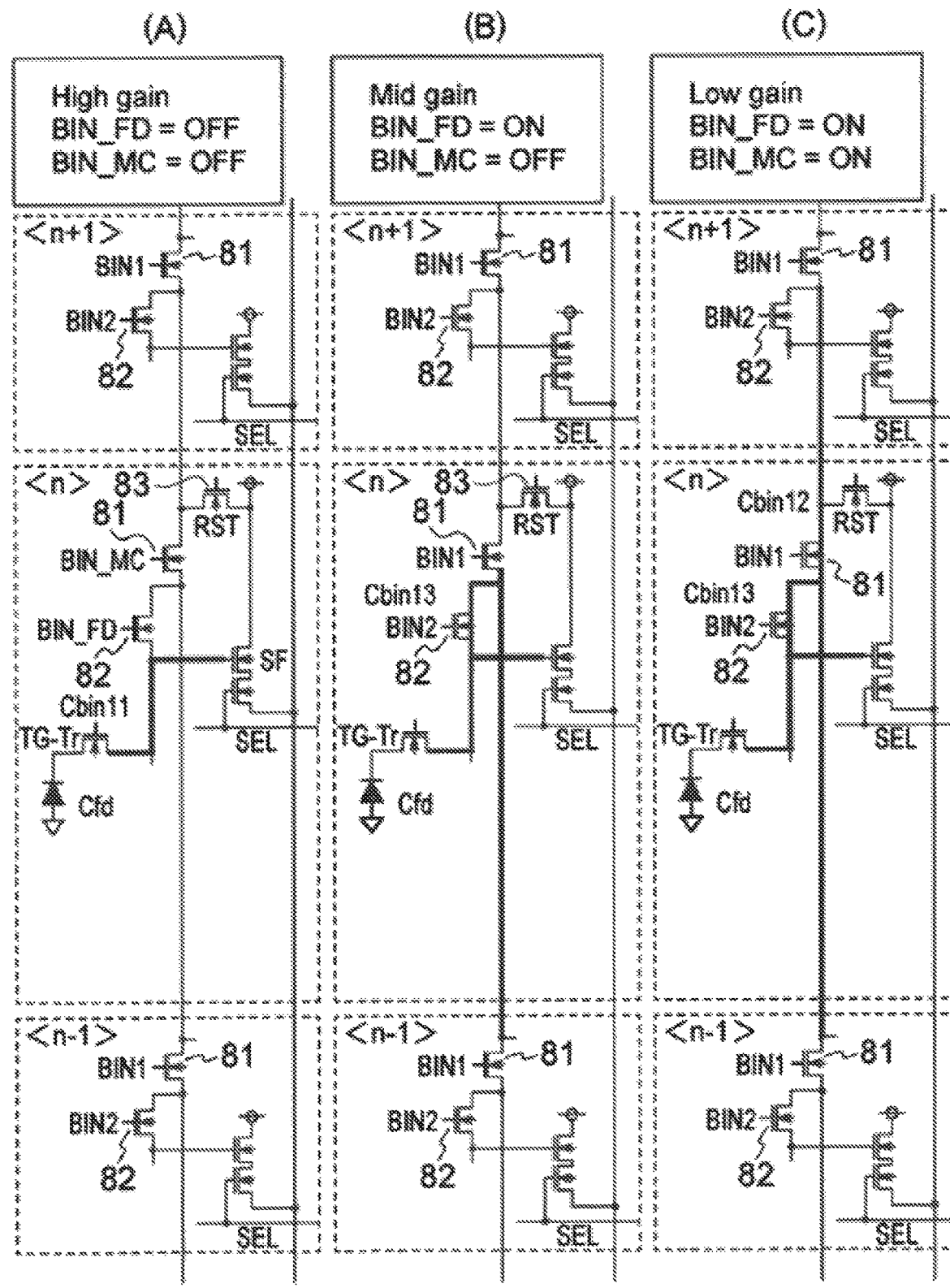
FIG. 16 schematically shows wired regions in which an additional capacitance is obtained in accordance with the ON or OFF states of the first binning transistor and the second binning transistor in the third embodiment.

FIG. 16 schematically shows wired regions in which an additional capacitance is obtained in accordance with the ON or OFF states of the first binning transistor (switch) 81 and the second binning transistor (switch) 82 in the third embodiment. Part (A) of FIG. 16 shows the state of high conversion gain in which the second binning switch (BIN_FD) 82 is in the OFF state and the first binning switch (BIN_MC) 81 is in the OFF state. Part (B) of FIG. 16 shows the state of middle conversion gain in which the second binning switch (BIN_FD) 82 is in the ON state and the first binning switch (BIN_MC) 81 is in the OFF state. Part (C) of FIG. 16 shows the state of low conversion gain in which the second binning switch (BIN_FD) 82 is in the ON state and the first binning switch (BIN_MC) 81 is in the ON state.

In the third embodiment, the conversion gain is high when the second binning switch (BIN_FD) 82 is in the OFF state and the first binning switch (BIN_MC) 81 is in the OFF state. In this case, added to the capacitance Cfd of the floating diffusion FD of the pixel PXL to be read are the gate capacitance C10 of the source follower transistor SF-Tr, the inter-wire capacitance C11 between the first contact wire 237 and the second contact wire 238, the inter-wire capacitance C12 between the second contact wire 238 and the third contact wire 239, and the junction capacitance C13 in the n+ diffusion layer 223 that forms the floating diffusion FD, totaling to an additional capacitance Cbin11 (=C10+C11+C12+C13). The first total capacitance Ctot11 of the floating diffusion FD for the high conversion gain is Cbin11.

In the third embodiment, the conversion gain is middle when the second binning switch (BIN_FD) 82 is in the ON state and the first binning switch (BIN_MC) 81 is in the OFF state. In this case, added to the capacitance Cfd of the floating diffusion FD of the pixel PXL to be read are the gate capacitance C10 of the source follower transistor SF-Tr, the inter-wire capacitance C11 between the first contact wire 237 and the second contact wire 238, the inter-wire capacitance C12 between the second contact wire 238 and the third contact wire 239, and the junction capacitance C13 in the n+ diffusion layer 223 that forms the floating diffusion FD, totaling to an additional capacitance Cbin11 (=C10+C11+C12+C13), and further added are the gate capacitance C14 of the second binning transistor 82, the inter-wire capacitance C15 between the fourth metal wire 249 of the first conductive layer (first metal layer) M1 and the eleventh metal wire 226 of the second conductive layer (second metal layer) M2, the inter-wire capacitance C16 between the fourth metal wire 249 of the first conductive layer (first metal layer) M1 and the tenth metal wire 255 connected to the second conductive layer (second metal layer) M2, and the inter-wire capacitance C17 between the fifth metal wire 250 of the first conductive layer (first metal layer) M1 and the eleventh metal wire 226 of the second conductive layer (second metal layer) M2, totaling to an additional capacitance Cbin13 (=C14+C15+C16+C17). The third total capacitance Ctot13 of the floating diffusion FD for the middle conversion gain is Cbin11+Cbin13.

In the third embodiment, the conversion gain is low when the second binning switch (BIN_FD) 82 is in the ON state and the first binning switch (BIN_MC) 81 is in the ON state. In this case, added to the capacitance Cfd of the floating diffusion FD of the pixel PXL to be read are the gate capacitance C10 of the source follower transistor SF-Tr, the inter-wire capacitance C11 between the first contact wire 237 and the second contact wire 238, the inter-wire capacitance C12 between the second contact wire 238 and the third contact wire 239, and the junction capacitance C13 in the n+ diffusion layer 223 that forms the floating diffusion FD, totaling to an additional capacitance Cbin11 (=C10+C11+C12+C13), and the gate capacitance C14 of the second binning transistor 82, the inter-wire capacitance C15 between the fourth metal wire 249 of the first conductive layer (first metal layer) M1 and the eleventh metal wire 226 of the second conductive layer (second metal layer) M2, the inter-wire capacitance C16 between the fourth metal wire 249 of the first conductive layer (first metal layer) M1 and the tenth metal wire 255 connected to the second conductive layer (second metal layer) M2, and the inter-wire capacitance C17 between the fifth metal wire 250 of the first conductive layer (first metal layer) M1 and the eleventh metal wire 226 of the second conductive layer (second metal layer) M2, totaling to an additional capacitance Cbin13 (=C14+C15+C16+C17), and further added are the gate capacitance C18 of the first binning transistor 81, the inter-wire capacitance C19 between the sixth metal wire 251 of the first conductive layer (first metal layer) M1 and the eleventh metal wire 226 of the second conductive layer (second metal layer) M2, and the inter-wire capacitance C20 between the sixth metal wire 251 of the first conductive layer (first metal layer) M1 and the tenth metal wire 255 connected to the second conductive layer (second metal layer) M2, totaling to an additional capacitance Cbin12 (=C18+C19+C20). The second total capacitance Ctot12 of the floating diffusion FD for the low conversion gain is Cbin11+Cbin13+Cbin12.

For the low conversion gain, when the second binning transistor 82 of the adjacent pixel PXLn+1 is in the ON state and the first binning transistor 81 thereof is in the OFF state, the third total capacitance of the adjacent pixel PXLn+1 is added to the second total capacitance Ctot12 (=Cbin11+Cbin13+Cbin12). For the low conversion gain, when the second binning transistor 82 of the adjacent pixel PXLn+1 is in the ON state and the first binning transistor 81 thereof is in the ON state, the second total capacitance of the adjacent pixel PXLn+1 is added to the second total capacitance Ctot12 (=Cbin11+Cbin13+Cbin12).

Figure 17:
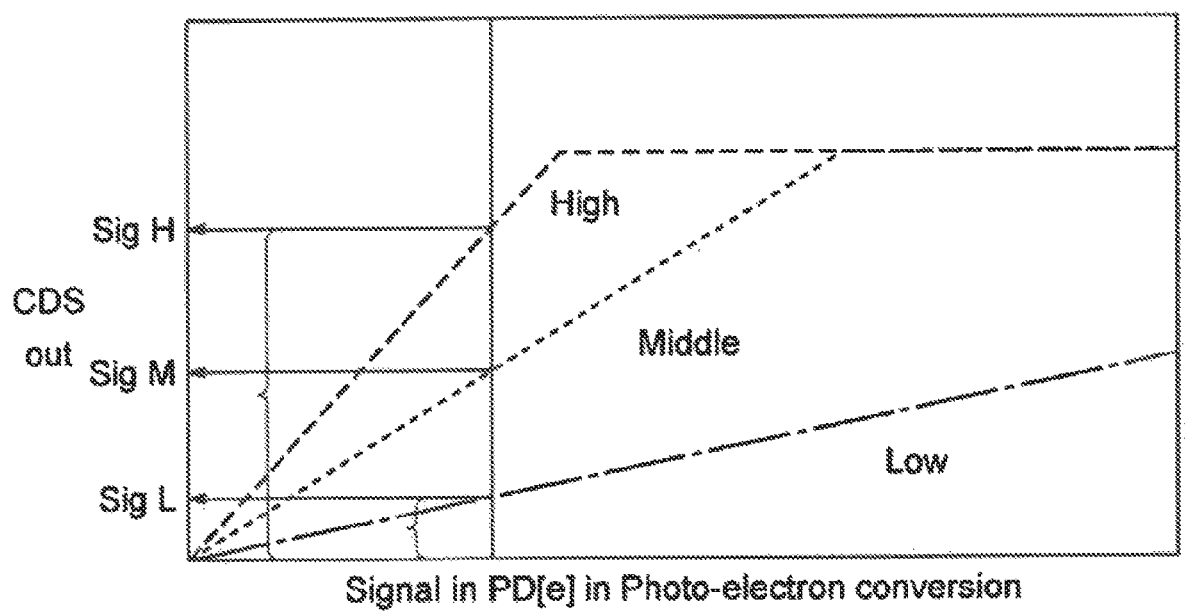
FIG. 17 shows input and output characteristics of high gain signals, middle gain signals, and low gain signals in the solid-state imaging device according to the third embodiment.

FIG. 17 shows input and output characteristics of high gain signals, middle gain signals, and low gain signals in the solid-state imaging device 10 according to the third embodiment. In FIG. 17, the abscissa represents (the quantity of charges produced by conversion of) the input light signal Q[e], and the ordinate represents the signal voltage Sig after the charge-voltage conversion.

In contrast to the solid-state imaging device of the comparative example shown in FIGS. 9A and 9B, the solid-state imaging device 10B of the third embodiment is configured such that the capacitance of the floating diffusion FD can be optimally adjusted to obtain a desired optimal value of the conversion gain in accordance with the mode. Thus, as shown in FIG. 17, the SN ratio at the changing point of the conversion gain can be optimized to obtain desired output characteristics that result in a high image quality.

The operation in the third embodiment for a wide dynamic range is basically the same as in the first embodiment described above except that the first and second capacitance changing signals BIN1n+1, BIN2n+1 of the pixel PXLn+1 adjacent to the upper side of the PXLn to be read can be switched to the H level or the L level at the same timing as (in phase with) the first and second capacitance changing signals BIN1n, BIN2n of the pixel PXLn to be read. Therefore, the details of the operation of the third embodiment will be skipped.

The third embodiment makes it possible not only to obtain the same effect as the first embodiment described above, but also to further optimize the capacitance of the floating diffusion FD and obtain a desired, more optimal value of the conversion gain in accordance with the mode. Thus, the SN ratio at the changing point of the conversion gain can be further optimized to obtain desired output characteristics that result in a high image quality.

Fourth Embodiment

Figure 18:
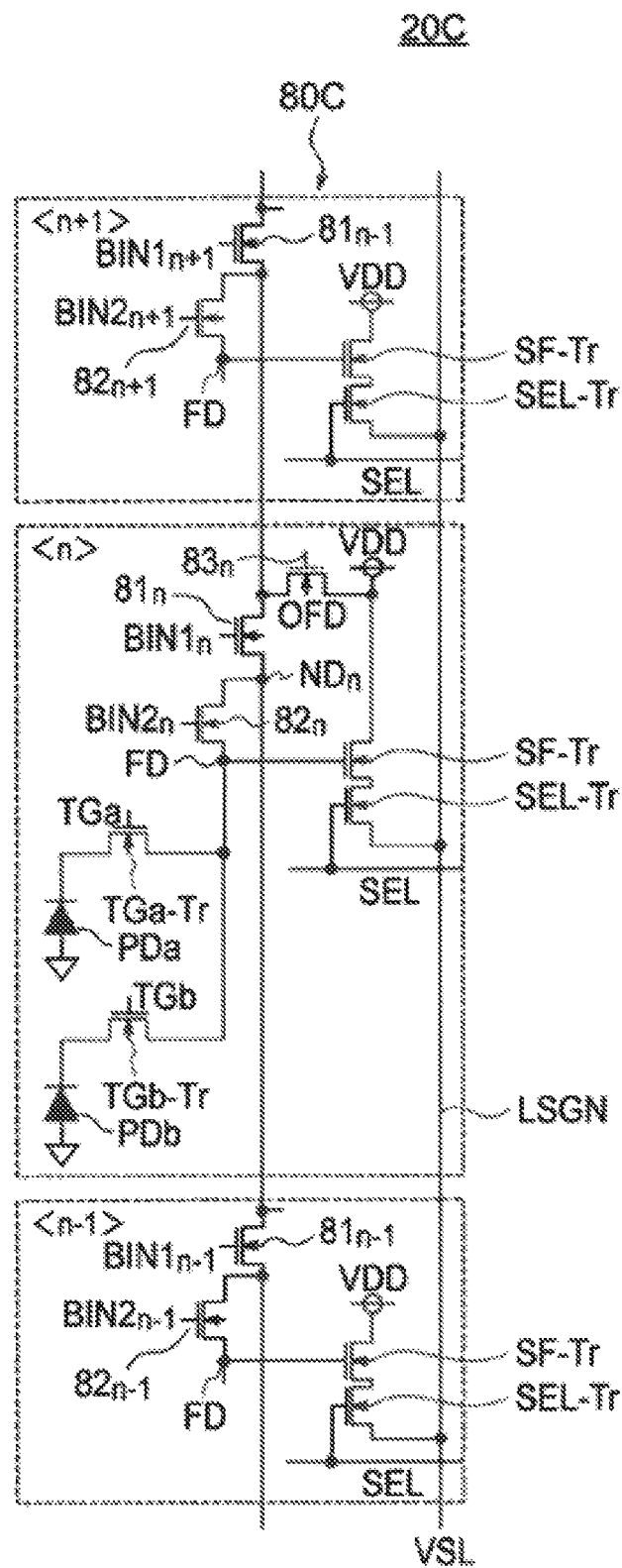
FIG. 18 shows an example configuration of the pixel part and the capacitance changing part according to the fourth embodiment of the present invention.

FIG. 18 shows an example configuration of the pixel part and the capacitance changing part according to a fourth embodiment of the present invention.

Figure 19:
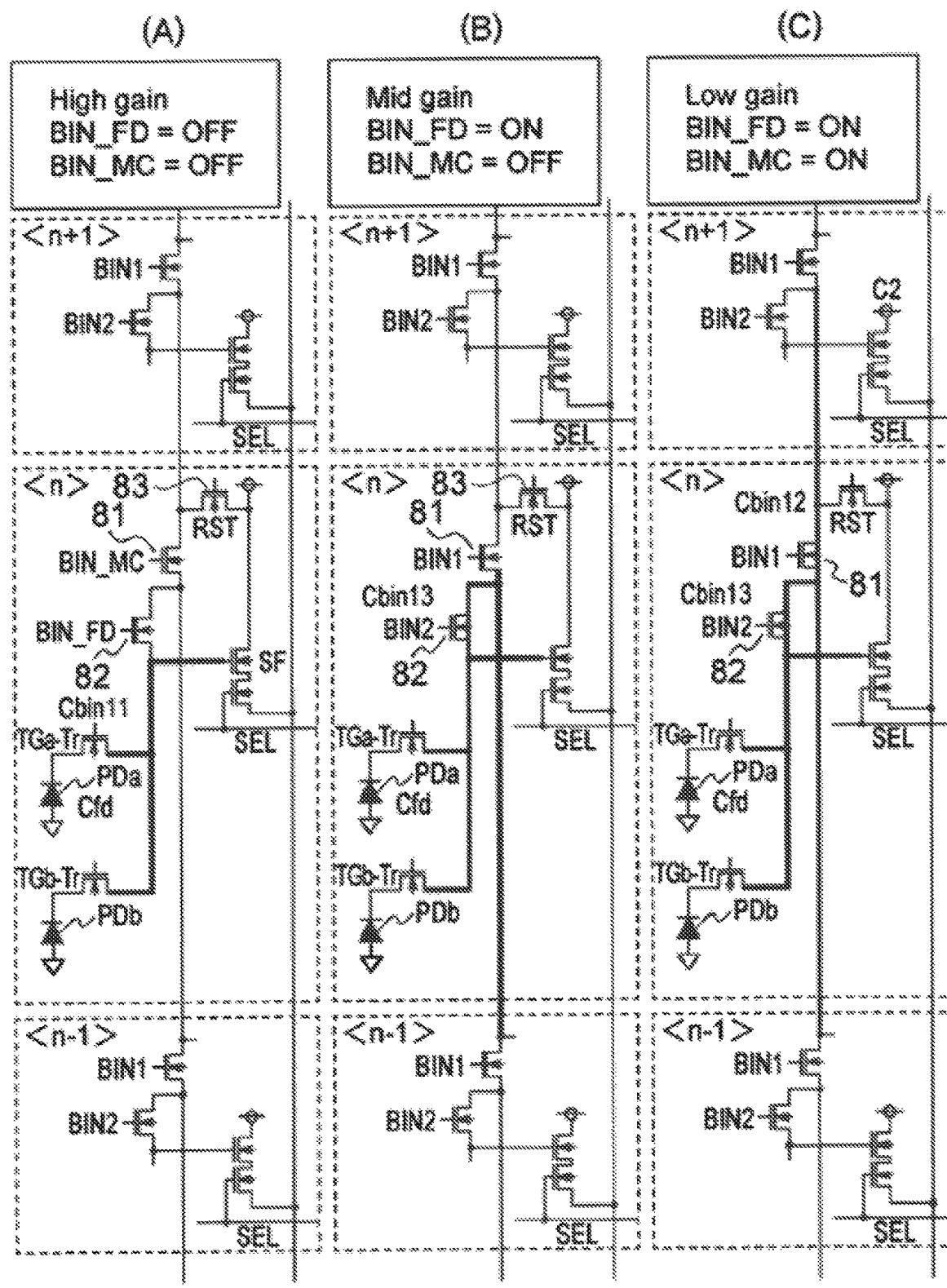
FIG. 19 schematically shows wired regions in which an additional capacitance is obtained in accordance with the ON or OFF states of the first binning transistor and the second binning transistor in the fourth embodiment.

FIG. 19 schematically shows wired regions in which an additional capacitance is obtained in accordance with the ON or OFF states of the first binning transistor (switch) 81 and the second binning transistor (switch) 82 in the fourth embodiment. Part (A) of FIG. 19 shows the state of high conversion gain in which the second binning switch (BIN_FD) 82 is in the OFF state and the first binning switch (BIN_MC) 81 is in the OFF state. Part (B) of FIG. 19 shows the state of middle conversion gain in which the second binning switch (BIN_FD) 82 is in the ON state and the first binning switch (BIN_MC) 81 is in the OFF state. Part (C) of FIG. 19 shows the state of low conversion gain in which the second binning switch (BIN_FD) 82 is in the ON state and the first binning switch (BIN_MC) 81 is in the ON state.

The pixel PXLC and the capacitance changing part 80C of the fourth embodiment differ from the pixel PXL and the capacitance changing part 80B of the third embodiment in the following point.

As shown in FIGS. 18 and 19, the solid-state imaging device 10C according to the fourth embodiment has a pixel-sharing structure in which one floating diffusion FD is shared by a plurality (e.g., two as in this example) of photodiodes PDa, PDb and transfer transistors TGa-Tr, TGb-Tr.

The fourth embodiment can produce the same effects as the third embodiment described above.

<Layout Pattern and Method of Forming Additional Capacitance>

A description is hereinafter given of example layout patterns, a method of forming the inter-wire capacitances, and a method of adjusting the MOS capacitance, in accordance with the configurations of the pixel part and the capacitance changing part of FIG. 18.

Figure 20:
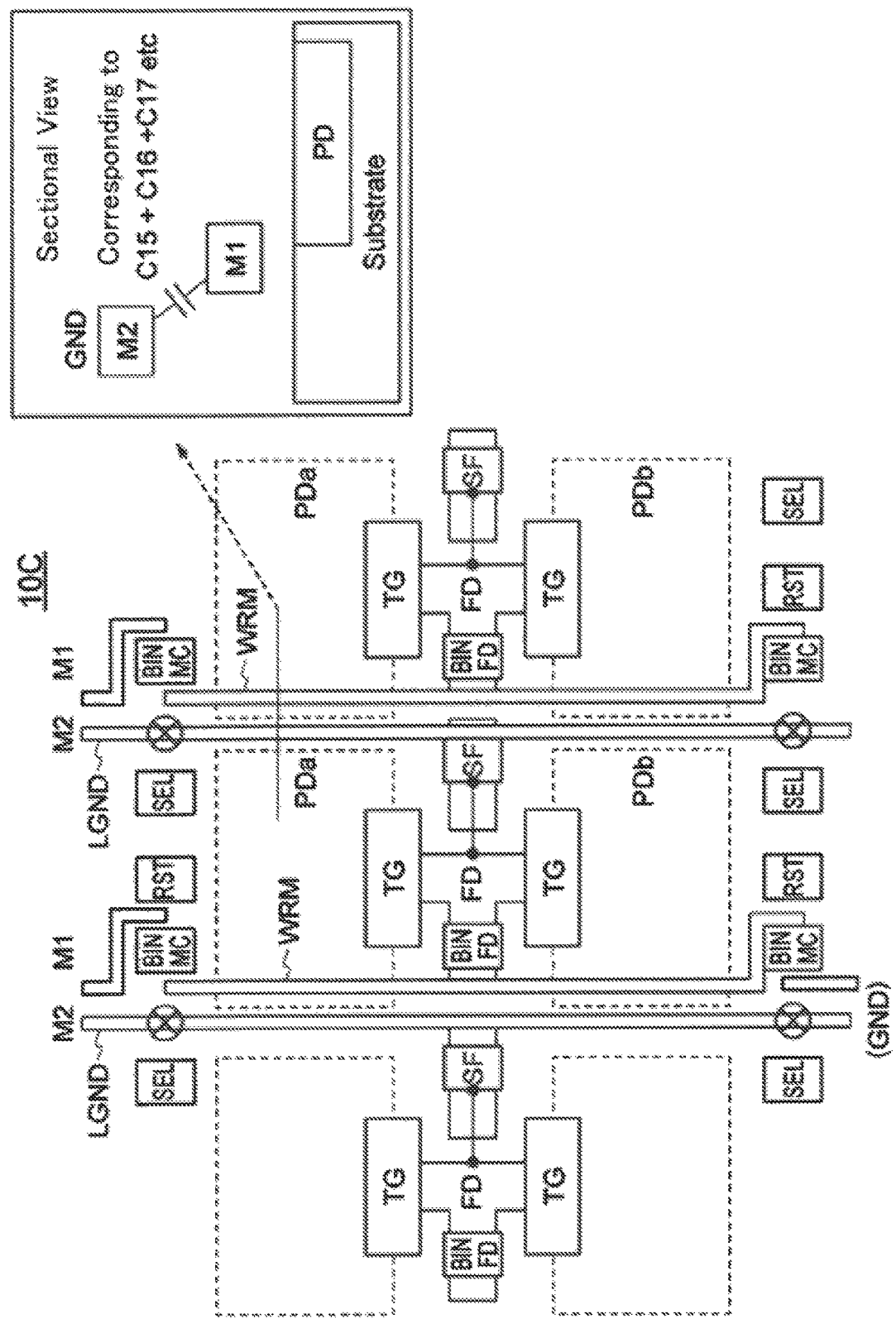
FIG. 20 shows a first example of a layout pattern corresponding to the configurations of the pixel part and the capacitance changing part of FIG. 18.
Figure 21:
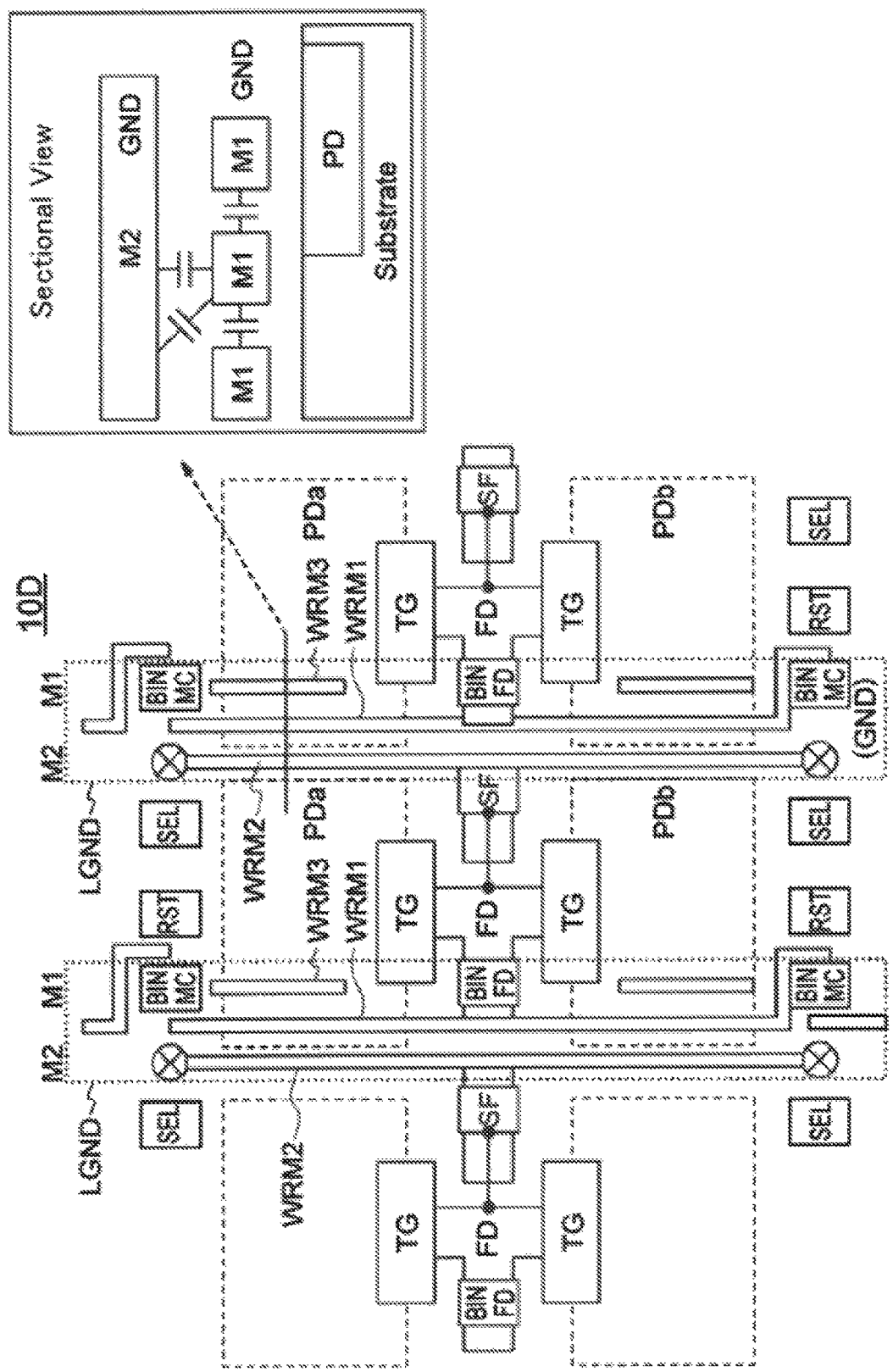
FIG. 21 shows a second example of the layout pattern corresponding to the configurations of the pixel part and the capacitance changing part of FIG. 18.
Figure 22:
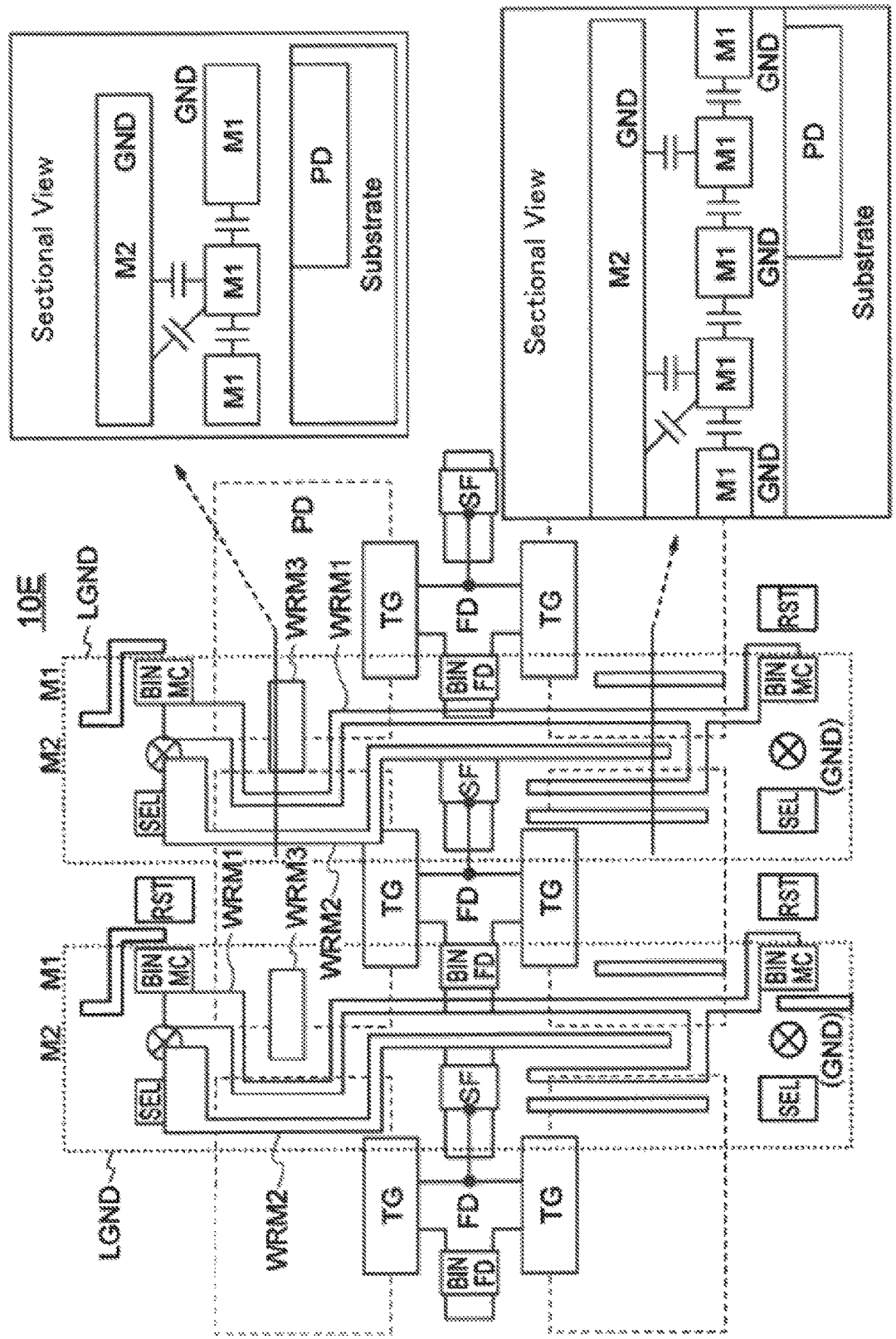
FIG. 22 shows a third example of the layout pattern corresponding to the configurations of the pixel part and the capacitance changing part of FIG. 18.
Figure 23:
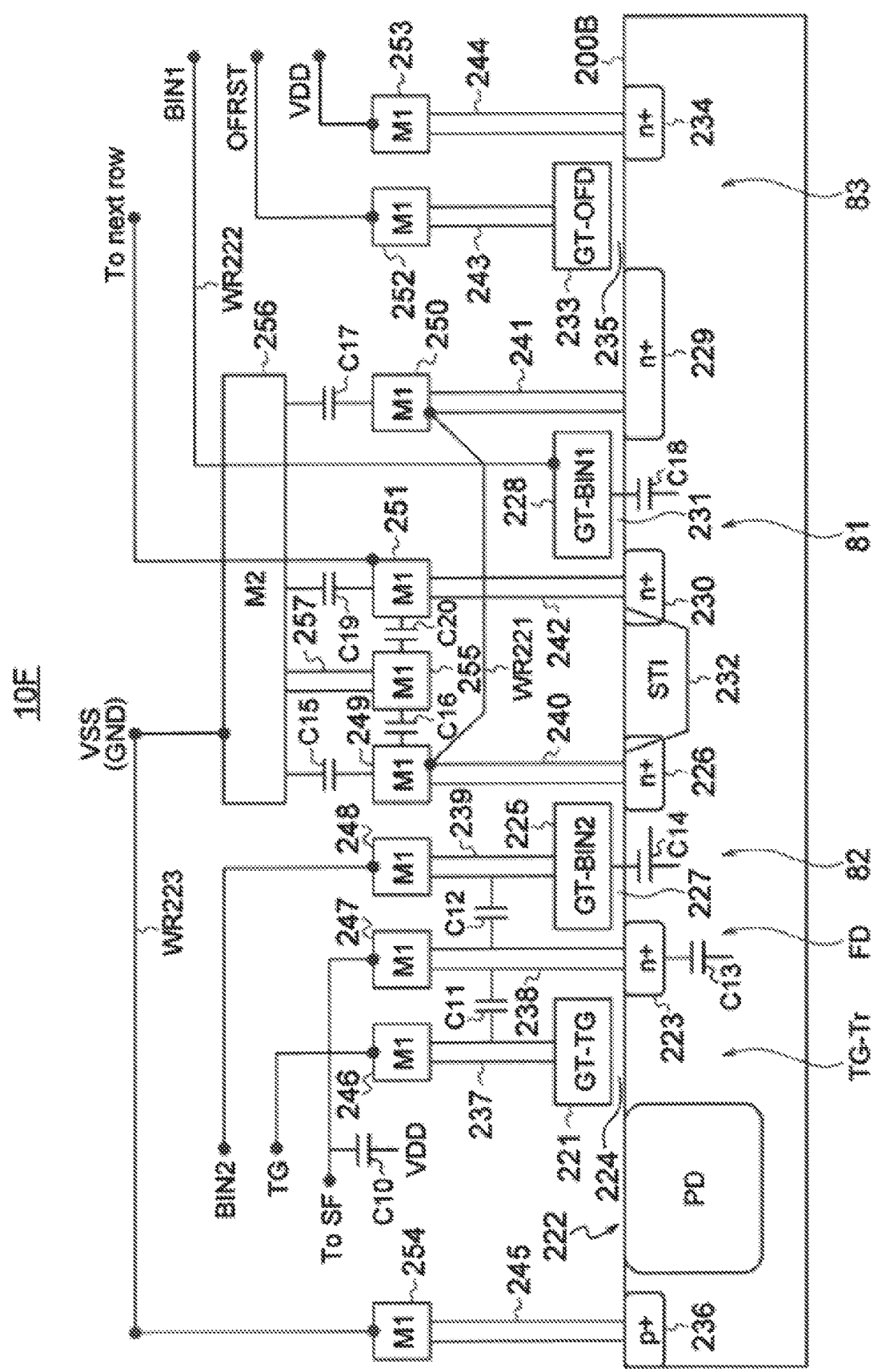
FIG. 23 illustrates a method of adjusting a MOS capacitance in the pixel part and the capacitance changing part of FIG. 13.

FIG. 20 shows a first example of a layout pattern corresponding to the configurations of the pixel part and the capacitance changing part of FIG. 18, and FIG. 20 is used to illustrate a method of forming inter-wire capacitances therein. FIG. 21 shows a second example of a layout pattern corresponding to the configurations of the pixel part and the capacitance changing part of FIG. 18, and FIG. 21 is used to illustrate a method of forming inter-wire capacitances therein. FIG. 22 shows a third example of a layout pattern corresponding to the configurations of the pixel part and the capacitance changing part of FIG. 18, and FIG. 22 is used to illustrate a method of forming inter-wire capacitances therein. FIG. 23 illustrates a method of adjusting a MOS capacitance in the pixel part and the capacitance changing part of FIG. 13.

In the example shown in FIG. 20, each pixel has one floating diffusion FD shared by the two photodiodes PDa, PDb and the transfer transistors TGa-Tr, TGb-Tr, and the wire WR that connects between the pixels and has the first binning transistors (BIN MC) disposed thereon is formed of a metal wire WRM of the first conductive layer (first metal layer) M1 so as to be substantially straight. A ground wire LGND is formed of a metal wire of the second conductive layer (second metal layer) M2 so as to be parallel with the metal wire WRM and able to form a capacitance. Between the metal wire WRM of the first conductive layer M1 and the ground wire LGND of the second conductive layer M2, there are formed the inter-wire capacitances C15, C16, C17, etc.

In the example shown in FIG. 21, each pixel has one floating diffusion FD shared by the two photodiodes PDa, PDb and the transfer transistors TGa-Tr, TGb-Tr, and the wire WR that connects between the pixels and has the first binning transistors (BIN MC) disposed thereon is formed of a metal wire WRM1 of the first conductive layer (first metal layer) M1 so as to be substantially straight. Along the metal wire WRM1, there are formed a plurality (e.g., two as in the example) of metal wires WRM2, WRM3 of the first conductive layer (first metal layer) M1 so as to be substantially straight and parallel with each other. A ground wire LGND is formed of a solid metal wire of the second conductive layer (second metal layer) M2 so as to be parallel with the metal wire WRM and able to form a capacitance. Between the metal wire WRM of the first conductive layer M1 and the ground wire LGND of the second conductive layer M2, there are formed the inter-wire capacitances C15, C16, C17, etc.

In the example shown in FIG. 22, each pixel has one floating diffusion FD shared by the two photodiodes PDa, PDb and the transfer transistors TGa-Tr, TGb-Tr, and the wire WR that connects between the pixels and has the first binning transistors (BIN MC) disposed thereon is formed of a metal wire WRM1 of the first conductive layer (first metal layer) M1 so as to bend at a plurality of portions. Along the metal wire WRM1, there are formed a plurality (e.g., two as in the example) of metal wires WRM2, WRM3 of the first conductive layer (first metal layer) M1 so as to bend at a plurality of portions and extend in parallel with each other. A ground wire LGND is formed of a solid metal wire of the second conductive layer (second metal layer) M2 so as to be parallel with the metal wire WRM and able to form a capacitance. Between the metal wire WRM of the first conductive layer M1 and the ground wire LGND of the second conductive layer M2, there are formed the inter-wire capacitances C15, C16, C17, etc.

The MOS capacitances can be adjusted by changing the transistor sizes of the first binning transistor 81 and the second binning transistor 82. In the example shown in FIG. 23, the gate capacitances are adjusted by enlarging the lengths of the gates 228, 225 or the thicknesses of the gate oxidation films 231, 227.

Application Examples

Figure 24A:
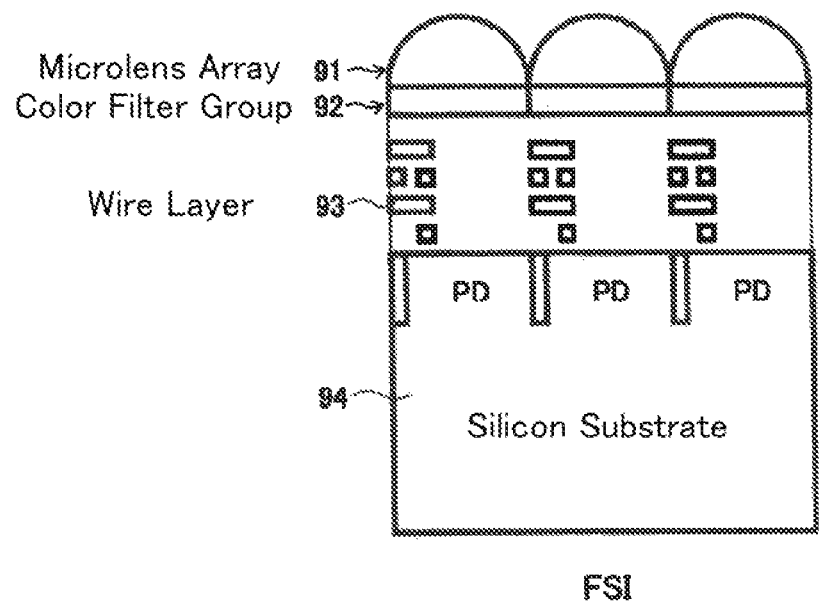
FIGS. 24A and 24B illustrate that the solid-state imaging device according to the embodiments of the present invention is applicable to both front-side illumination image sensors and back-side illumination image sensors.
Figure 24B:
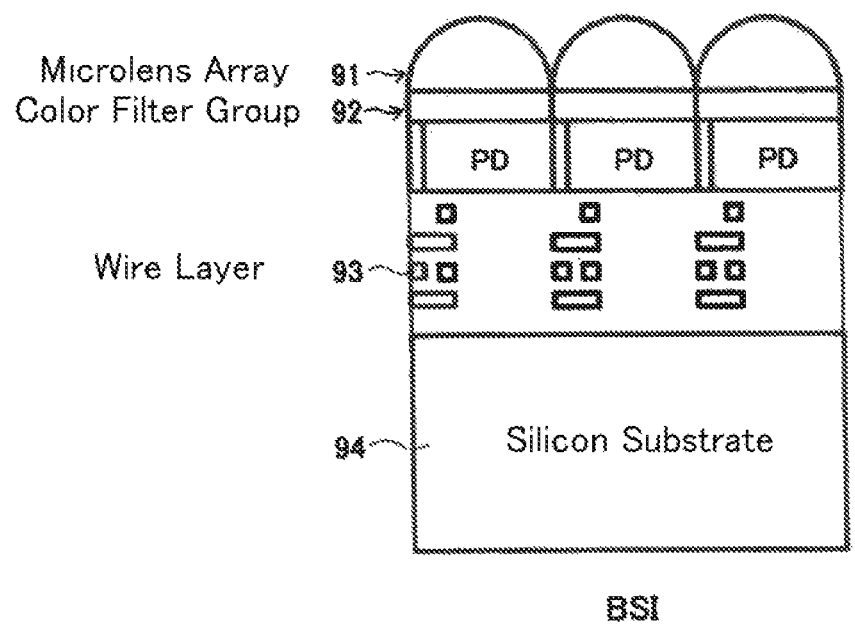

FIGS. 24A and 24B illustrate that the solid-state imaging device according to the embodiments of the present invention is applicable to both front-side illumination image sensors and back-side illumination image sensors. FIG. 24A schematically shows a front-side illumination image sensor, and FIG. 24B schematically shows a back-side illumination image sensor.

In FIGS. 24A and 24B, the sign 91 denotes a microlens array, the sign 92 denotes a color filter group, the sign 93 denotes a wire layer, and the sign 94 denotes a silicon substrate.

As shown in FIGS. 24A and 24B, the solid-state imaging device 10 of the embodiment described above is applicable to both front-side illumination (FSI) image sensors and back-side illumination (BSI) image sensors.

The solid-state imaging devices 10, 10A to 10F described above can be applied, as an imaging device, to electronic apparatuses such as digital cameras, video cameras, mobile terminals, surveillance cameras, and medical endoscope cameras.

Figure 25:
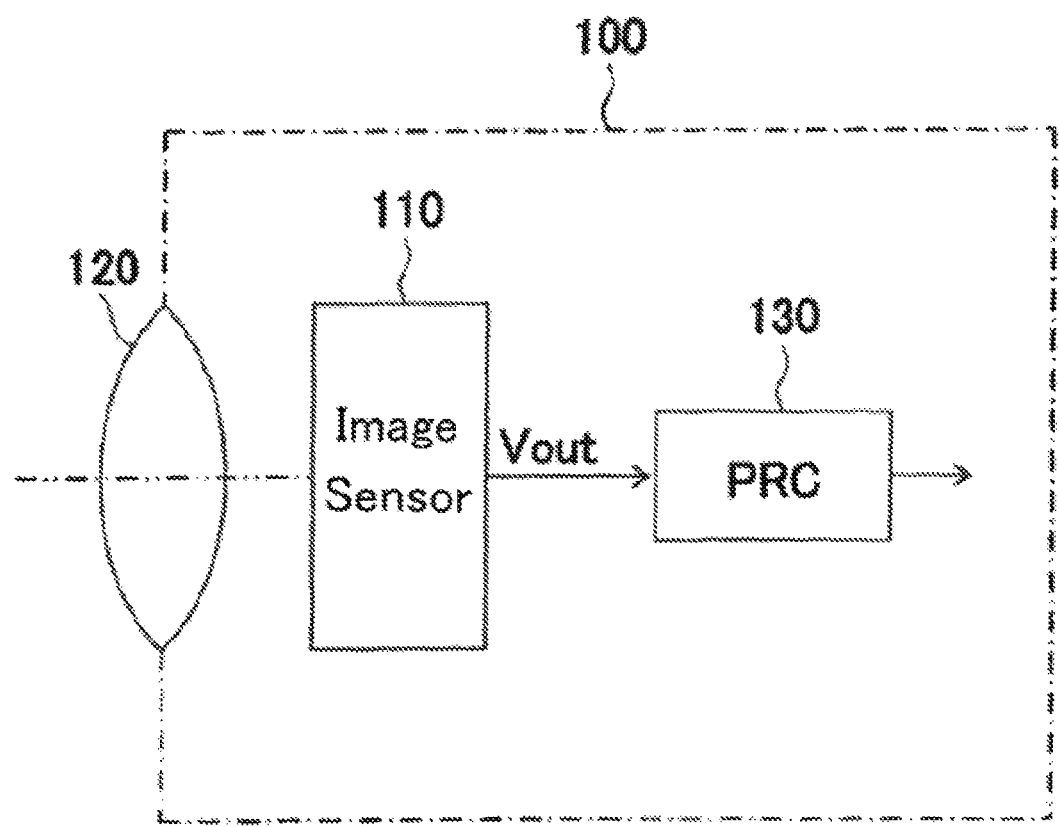
FIG. 25 shows an example configuration of an electronic apparatus to which the solid-state imaging devices according to the embodiments of the present invention can be applied.

FIG. 25 shows an example configuration of an electronic apparatus including a camera system to which the solid-state imaging device according to the embodiments of the present invention is applied.

As shown in FIG. 25, the electronic apparatus 100 includes a CMOS image sensor 110 that can be constituted by the solid-state imaging device 10 according to the embodiments of the present invention. Further, the electronic apparatus 100 includes an optical system (such as a lens) 120 for redirecting the incident light to pixel regions of the CMOS image sensor 110 (to form a subject image). The electronic apparatus 100 includes a signal processing circuit (PRC) 130 for processing output signals of the CMOS image sensor 110.

The signal processing circuit 130 performs predetermined signal processing on the output signals of the CMOS image sensor 110. The image signals processed in the signal processing circuit 130 can be handled in various manners. For example, the image signals can be displayed as a video image on a monitor having a liquid crystal display, or the image signals can be printed by a printer or recorded directly on a storage medium such as a memory card.

As described above, a high-performance, compact, and low-cost camera system can be provided that includes the solid-state imaging device 10, 10A to 10F as the CMOS image sensor 110. Further, it is possible to produce electronic apparatuses such as surveillance cameras and medical endoscope cameras that are used for applications where cameras are required to be installed under restricted conditions such as the installation size, number of connectable cables, cable length, and installation height.

LIST OF REFERENCE NUMBERS 10, 10A to 10F solid-state imaging devices
20 pixel part
200 semiconductor substrate
210 to 214 first contact wire to fifth contact wire
M1 first conductive layer (first metal layer)
215 to 219 first metal wire to fifth metal wire
M2 second conductive layer (second metal layer)
220 sixth metal wire
237 to 245 first contact wire to ninth contact wire
246 to 255 first metal wire to tenth metal wire
256 eleventh metal wire
30 vertical scanning circuit
40 reading circuit
50 horizontal scanning circuit
60 timing control circuit
70 reading part
80, 80A to 80C capacitance changing part
81 first binning switch
82 second binning switch
83 overflow drain (OFD) gate
91 microlens array
92 color filter group
93 wire layer
94 silicon substrate
100 electronic apparatus
110 CMOS image sensor
120 optical system
130 signal processing circuit (PRC)

What is claimed is:

1. A solid-state imaging device comprising:
a pixel part including pixels arranged therein,
wherein the pixels each include:
a photoelectric conversion part for storing therein, in a storage period, charges generated by photoelectric conversion;
a charge transfer gate part for transferring, in a transfer period, the charges stored in the photoelectric conversion part;
a floating diffusion to which the charges stored in the photoelectric conversion part are transferred through the charge transfer gate part;
a source follower element for converting the charges in the floating diffusion into a voltage signal with a conversion gain corresponding to the quantity of the charges;
a capacitance changing part for changing a capacitance of the floating diffusion in accordance with a capacitance changing signal;
a first conductive layer forming a plurality of wires connected at least to diffusion layers of the binning switch; and
a second conductive layer different from the first conductive layer, the second conductive layer forming at least one wire that forms a capacitance with associated one of the plurality of wires of the first conductive layer,
wherein the capacitance of the floating diffusion is changed by the capacitance changing part in a predetermined period within one reading period associated with the storage period, such that the conversion gain is changed within the one reading period,
wherein the capacitance changing part includes a binning switch connected between the floating diffusions of at least two pixels adjacent to each other, the binning switch being formed of a field effect transistor configured to be brought into ON or OFF state selectively in accordance with the capacitance changing signal,
wherein the capacitance changing part is capable of changing the conversion gain of the floating diffusion of an associated pixel to be read,
wherein the binning switch is formed such that at least one of a parasitic capacitance and a wire capacitance of a wire connected to the binning switch, each having a value in accordance with the ON or OFF state, is added to the capacitance of the floating diffusion of the associated pixel.

2. The solid-state imaging device according to claim 1, further comprising:
a second wire connecting the floating diffusion to a gate of the source follower element formed of a field effect transistor;
a third wire connected to a diffusion layer on one side of the binning switch connected to the floating diffusion; and
a fourth wire connected to a diffusion layer on the other side of the binning switch,
wherein the second wire and the third wire are electrically connected to each other,
wherein the second wire, the third wire, and the fourth wire include the first conductive layer, and
wherein the second conductive layer is opposed at least to the first conductive layer of the third wire and the fourth wire.

3. The solid-state imaging device according to claim 2, further comprising a first wire including the first conductive layer and configured to transmit a control signal to the charge transfer gate part,
wherein when the binning switch is in the OFF state, the capacitance changing part adds, to the capacitance of the floating diffusion of the associated pixel, at least one of:
an inter-wire capacitance between the first wire and the second wire;
a gate capacitance of the source follower element;
a junction capacitance of the floating diffusion; and
an inter-wire capacitance between the first conductive layer including the third wire and the second conductive layer.

4. The solid-state imaging device according to claim 2, further comprising a first wire including the first conductive layer and configured to transmit a control signal to the charge transfer gate part,
  wherein when the binning switch is in the ON state, the capacitance changing part adds, to the capacitance of the floating diffusion of the associated pixel, at least one of:
    an inter-wire capacitance between the first wire and the second wire;
    a gate capacitance of the source follower element;
    a junction capacitance of the floating diffusion; and
    an inter-wire capacitance between the first conductive layer including the third wire and the second conductive layer, and
  the capacitance changing part further adds at least one of:
    a gate capacitance of the binning switch; and
    an inter-wire capacitance between the first conductive layer including the fourth wire and the second conductive layer.

5. The solid-state imaging device according to claim 1, wherein the capacitance changing part includes:
  a first binning switch connected to a wire between the floating diffusions of two pixels adjacent to each other, the first binning switch being configured to be brought into ON or OFF state selectively in accordance with a first capacitance changing signal; and
  a second binning switch connected between a wire on a side of the first binning switch proximal to the charge transfer gate part and the floating diffusion, the second binning switch being configured to be brought into ON or OFF state selectively in accordance with a second capacitance changing signal,
  wherein the first binning switch is formed such that, on a condition that the second binning switch is in the ON state, at least a parasitic capacitance and a wire capacitance of the wire connected to the first binning switch, each having a value in accordance with the ON or OFF state, are added to the capacitance of the floating diffusion of the associated pixel to be read, and
  wherein the second binning switch is formed such that at least a parasitic capacitance and a wire capacitance of the wire connected to the second binning switch, each having a value in accordance with the ON or OFF state, are added to the capacitance of the floating diffusion of the associated pixel to be read.

6. The solid-state imaging device according to claim 5, further comprising:
  a first conductive layer that forms wires connected at least to diffusion layers of the first binning switch and a plurality of wires connected at least to a diffusion layer connected to a side of the second binning switch proximal to the first binning switch; and
  a second conductive layer different from the first conductive layer, the second conductive layer forming at least one wire that forms a capacitance with associated one of the wires of the first conductive layer.

7. The solid-state imaging device according to claim 6, further comprising:
  a second wire connecting a diffusion layer on one side of the second binning switch serving as the floating diffusion to a gate of the source follower element formed of a field effect transistor;
  a third wire for transmitting the second capacitance changing signal to a gate of the second binning switch;
  a fourth wire connected to a diffusion layer on the other side of the second binning switch;
  a fifth wire connected to a diffusion layer on one side of the first binning switch; and
  a sixth wire connected to a diffusion layer on the other side of the first binning switch,
  wherein the fourth wire and the fifth wire are electrically connected to each other,
  wherein the second wire, the third wire, the fourth wire, the fifth wire, and the sixth wire include the first conductive layer, and
  wherein the second conductive layer is opposed at least to the first conductive layer of the fourth wire, the fifth wire, and the sixth wire.

8. The solid-state imaging device according to claim 7, further comprising a first wire including the first conductive layer and configured to transmit a control signal to the charge transfer gate part,
  wherein when the second binning switch is in the OFF state, the capacitance changing part adds, to the capacitance of the floating diffusion of the associated pixel, at least one of:
    an inter-wire capacitance between the first wire and the second wire;
    an inter-wire capacitance between the second wire and the third wire;
    a gate capacitance of the source follower element; and
    a junction capacitance of the diffusion layer on one side of the second binning switch.

9. The solid-state imaging device according to claim 7, further comprising a first wire including the first conductive layer and configured to transmit a control signal to the charge transfer gate part,
  wherein when the second binning switch is in the ON state and the first binning switch is in the OFF state, the capacitance changing part adds, to the capacitance of the floating diffusion of the associated pixel, at least one of:
    an inter-wire capacitance between the first wire and the second wire;
    an inter-wire capacitance between the second wire and the third wire;
    a gate capacitance of the source follower element; and
    a junction capacitance of the diffusion layer on one side of the second binning switch, and
  the capacitance changing part further adds at least one of:
    a gate capacitance of the second binning switch;
    an inter-wire capacitance between the first conductive layer including the fourth wire and the second conductive layer; and
    an inter-wire capacitance between the first conductive layer including the fifth wire and the second conductive layer.

10. The solid-state imaging device according to claim 7, further comprising a first wire including the first conductive layer and configured to transmit a control signal to the charge transfer gate part,
  wherein when the second binning switch is in the ON state and the first binning switch is in the ON state, the capacitance changing part adds, to the capacitance of the floating diffusion of the associated pixel, at least one of:
    an inter-wire capacitance between the first wire and the second wire;
    an inter-wire capacitance between the second wire and the third wire;
    a gate capacitance of the source follower element; and
    a junction capacitance of the diffusion layer on one side of the second binning switch, and the capacitance changing part further adds at least one of:
  a gate capacitance of the second binning switch;
  an inter-wire capacitance between the first conductive layer including the fourth wire and the second conductive layer; and
  an inter-wire capacitance between the first conductive layer including the fifth wire and the second conductive layer, and
the capacitance changing part further adds at least one of:
  a gate capacitance of the first binning switch; and
  an inter-wire capacitance between the first conductive layer including the sixth wire and the second conductive layer.

11. The solid-state imaging device according to claim 9, further comprising: a tenth wire disposed between the fourth wire and the sixth wire and/or between the fifth wire and the sixth wire, the tenth wire being connected to the second conductive layer capable of forming a capacitance with the fourth wire and the sixth wire or with the fifth wire and the sixth wire, the first conductive layer being formed of the fourth wire, the fifth wire, and the sixth wire,
  wherein the capacitance changing part adds, to the capacitance of the floating diffusion of the associated pixel, a capacitance formed by the tenth wire with the fourth wire and the sixth wire and/or with the fifth wire and the sixth wire, in accordance with the ON or OFF state of the first binning switch and the second binning switch.

12. The solid-state imaging device according to claim 1, wherein the second conductive layer is connected to a reference potential.

13. The solid-state imaging device according to claim 1, wherein all of a plurality of pixels connected together via the binning switches share a reset element that discharges charges of the floating diffusion during a reset period.

14. The solid-state imaging device according to claim 1, wherein the capacitance changing part includes an overflow gate connected to the binning switch connected between the pixels and configured to discharge charges overflowing from the floating diffusion.

15. The solid-state imaging device according to claim 1, wherein the pixel part has a pixel-sharing structure in which the one floating diffusion is shared by a plurality of the photoelectric conversion parts and a plurality of the charge transfer gate parts.

16. The solid-state imaging device according to claim 1, wherein the solid-state imaging device is of a front-side illumination type or a back-side illumination type.

17. A method of driving a solid-state imaging device, the solid-state imaging device including a pixel part including pixels arranged therein,
  wherein the pixels each include:
  a photoelectric conversion part for storing therein, in a storage period, charges generated by photoelectric conversion;
  a charge transfer gate part for transferring, in a transfer period, the charges stored in the photoelectric conversion part;
  a floating diffusion to which the charges stored in the photoelectric conversion part are transferred through the charge transfer gate part;
  a source follower element for converting the charges in the floating diffusion into a voltage signal with a conversion gain corresponding to the quantity of the charges;
  a capacitance changing part for changing a capacitance of the floating diffusion in accordance with a capacitance changing signal;
  a first conductive layer forming a plurality of wires connected at least to diffusion layers of the binning switch; and
  a second conductive layer different from the first conductive layer, the second conductive layer forming at least one wire that forms a capacitance with associated one of the plurality of wires of the first conductive layer,
  wherein the capacitance of the floating diffusion is changed by the capacitance changing part in a predetermined period within one reading period associated with the storage period, such that the conversion gain is changed within the one reading period,
the method comprising:
forming the capacitance changing part by connecting between the floating diffusions of at least two pixels adjacent to each other with a binning switch formed of a field effect transistor;
forming the binning switch such that at least one of a parasitic capacitance and a wire capacitance of a wire connected to the binning switch, each having a value in accordance with the ON or OFF state, is added to the capacitance of the floating diffusion of the associated pixel; and
changing a conversion gain of the floating diffusion of an associated pixel to be read, by bringing the binning switch into ON or OFF state selectively in accordance with the capacitance changing signal.

18. An electronic apparatus comprising:
a solid-state imaging device; and
an optical system for forming a subject image on the solid-state imaging device,
wherein the solid-state imaging device includes a pixel part including pixels arranged therein,
wherein the pixels each include:
a photoelectric conversion part for storing therein, in a storage period, charges generated by photoelectric conversion;
a charge transfer gate part for transferring, in a transfer period, the charges stored in the photoelectric conversion part;
a floating diffusion to which the charges stored in the photoelectric conversion part are transferred through the charge transfer gate part;
a source follower element for converting the charges in the floating diffusion into a voltage signal with a conversion gain corresponding to the quantity of the charges;
a capacitance changing part for changing a capacitance of the floating diffusion in accordance with a capacitance changing signal;
a first conductive layer forming a plurality of wires connected at least to diffusion layers of the binning switch; and
a second conductive layer different from the first conductive layer, the second conductive layer forming at least one wire that forms a capacitance with associated one of the plurality of wires of the first conductive layer,
wherein the capacitance of the floating diffusion is changed by the capacitance changing part in a predetermined period within one reading period associated with the storage period, such that the conversion gain is changed within the one reading period,
wherein the capacitance changing part includes a binning switch connected between the floating diffusions of at least two pixels adjacent to each other, the binning switch being formed of a field effect transistor configured to be brought into ON or OFF state selectively in accordance with the capacitance changing signal, wherein the capacitance changing part is capable of changing the conversion gain of the floating diffusion of an associated pixel to be read, and wherein the binning switch is formed such that at least one of a parasitic capacitance and a wire capacitance of a wire connected to the binning switch, each having a value in accordance with the ON or OFF state, is added to the capacitance of the floating diffusion of the associated pixel.

* * * * *